(12) United States Patent
Chang et al.

(10) Patent No.: US 12,557,394 B2
(45) Date of Patent: Feb. 17, 2026

(54) DEVICE HAVING HYBRID CELL REGIONS AND METHOD OF MANUFACTURING SAME

(71) Applicant: TAIWAN SEMICONDUCTOR MANUFACTURING COMPANY, LTD., Hsinchu (TW)

(72) Inventors: Han-Chung Chang, Hsinchu (TW); Kuang-Ching Chang, Hsinchu (TW); Jia-Hong Gao, Hsinchu (TW); Po-Chih Cheng, Hsinchu (TW); Hui-Zhong Zhuang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 423 days.

(21) Appl. No.: 18/333,405

(22) Filed: Jun. 12, 2023

(65) Prior Publication Data
US 2024/0274592 A1 Aug. 15, 2024

Related U.S. Application Data

(60) Provisional application No. 63/484,680, filed on Feb. 13, 2023.

(51) Int. Cl.
| | |
|---|---|
| *H10D 89/10* | (2025.01) |
| *H10D 30/01* | (2025.01) |
| *H10D 64/01* | (2025.01) |
| *H10D 84/40* | (2025.01) |
| *H10D 84/85* | (2025.01) |

(52) U.S. Cl.
CPC ........... *H10D 89/10* (2025.01); *H10D 30/027* (2025.01); *H10D 64/01* (2025.01); *H10D 84/40* (2025.01); *H10D 84/859* (2025.01)

(58) Field of Classification Search
None
See application file for complete search history.

(56) References Cited

U.S. PATENT DOCUMENTS

| | | |
|---|---|---|
| 11,515,199 B2 | 11/2022 | Lin et al. |
| 11,803,683 B2 | 10/2023 | Yang et al. |

(Continued)

FOREIGN PATENT DOCUMENTS

| | | |
|---|---|---|
| CN | 114927611 | 8/2022 |
| DE | 102020115994 | 5/2021 |

(Continued)

*Primary Examiner* — Bilkis Jahan
(74) *Attorney, Agent, or Firm* — Hauptman Ham, LLP

(57) ABSTRACT

A cell region of a semiconductor device includes: active regions (ARs) formed as predetermined shapes on a substrate including first and second ARs having a first shape and correspondingly first and second dopant types, a third AR having a second shape and the second dopant type, and a fourth AR having a third shape and the first dopant type. The first and second ARs are arranged in a first area of the cell region. The third and fourth ARs are arranged in a second area of the cell region. The second area is adjacent to the first area relative to a first direction (e.g., Y-axis (vertical adjacency-architecture) or X-axis (horizontal adjacency-architecture)). The first shape is smaller than the second shape. The second shape is smaller than the third shape.

20 Claims, 15 Drawing Sheets

(56) References Cited

U.S. PATENT DOCUMENTS

| | | |
|---|---|---|
| 11,995,388 B2 | 5/2024 | Wang et al. |
| 2017/0077910 A1 | 3/2017 | Kim et al. |
| 2018/0342462 A1* | 11/2018 | Kuchanuri ............ H01L 23/544 |
| 2020/0006335 A1* | 1/2020 | Zhuang ................ H10D 84/834 |
| 2020/0019667 A1* | 1/2020 | Lin ........................ H10D 89/10 |
| 2020/0019670 A1* | 1/2020 | Chang ....................... G03F 1/70 |
| 2020/0134125 A1* | 4/2020 | Huang .................. G06F 30/392 |
| 2021/0143850 A1 | 5/2021 | Lee et al. |
| 2021/0294957 A1* | 9/2021 | Sue ....................... G06F 30/398 |
| 2022/0114320 A1 | 4/2022 | Yu et al. |
| 2022/0139901 A1 | 5/2022 | Cho et al. |

FOREIGN PATENT DOCUMENTS

| | | |
|---|---|---|
| DE | 102020125839 | 9/2021 |
| DE | 102021115945 | 7/2022 |
| KR | 10-2020-0037108 | 4/2020 |
| KR | 10-2021-0123179 | 10/2021 |
| TW | I649782 | 2/2019 |
| TW | 202240793 | 10/2022 |
| TW | 202249224 | 12/2022 |

\* cited by examiner

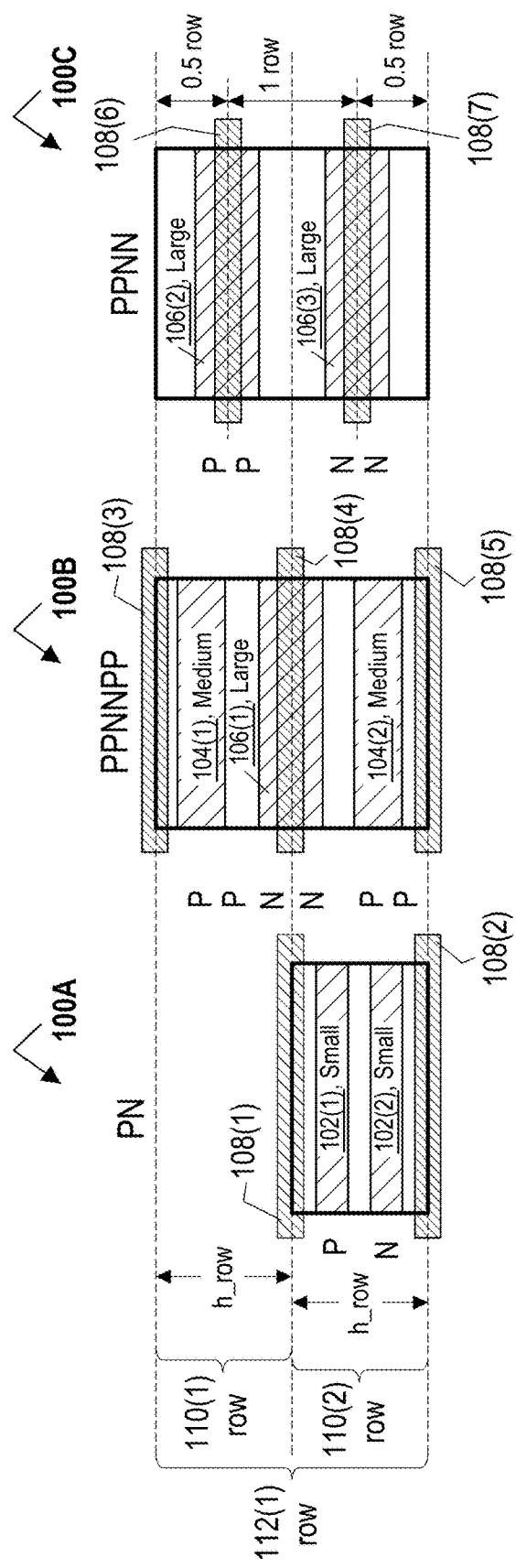
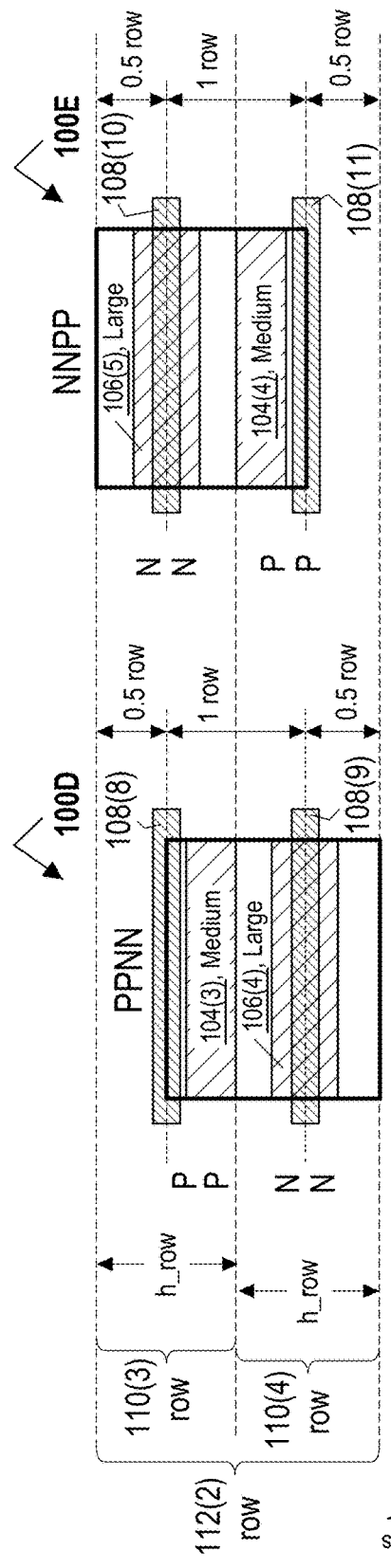
FIG. 1A  FIG. 1B  FIG. 1C  FIG. 1D  FIG. 1E

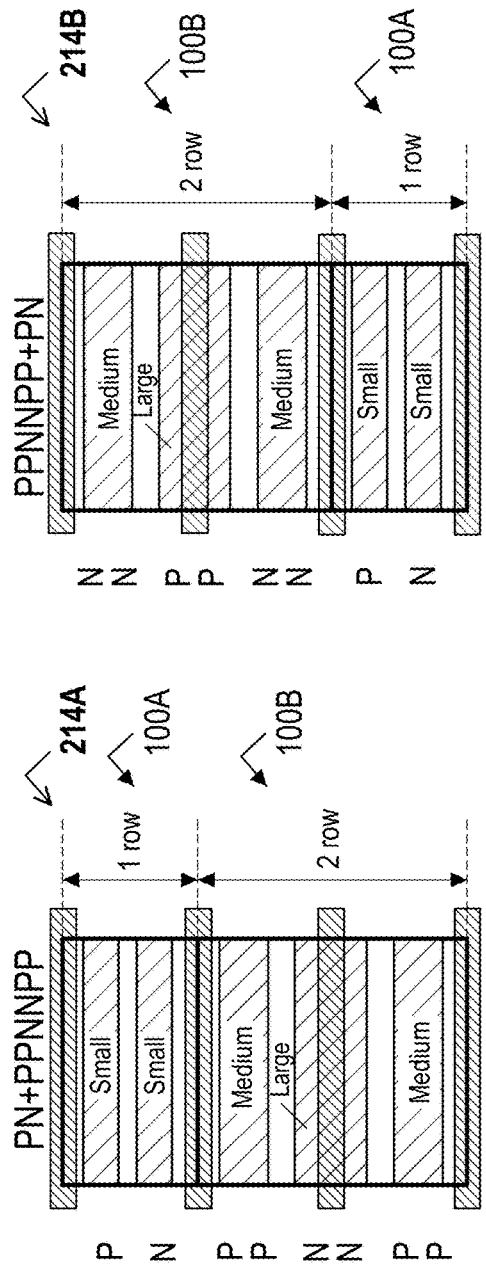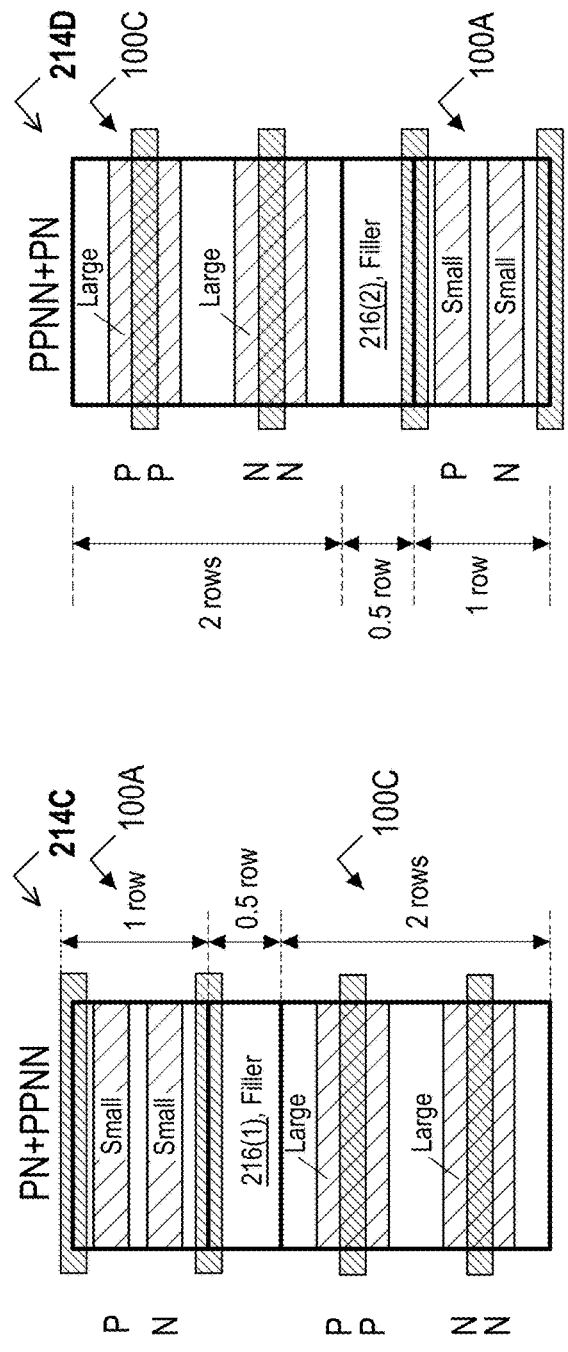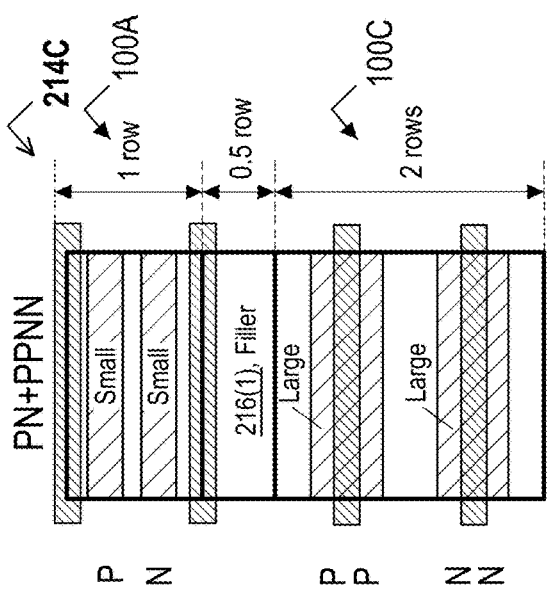

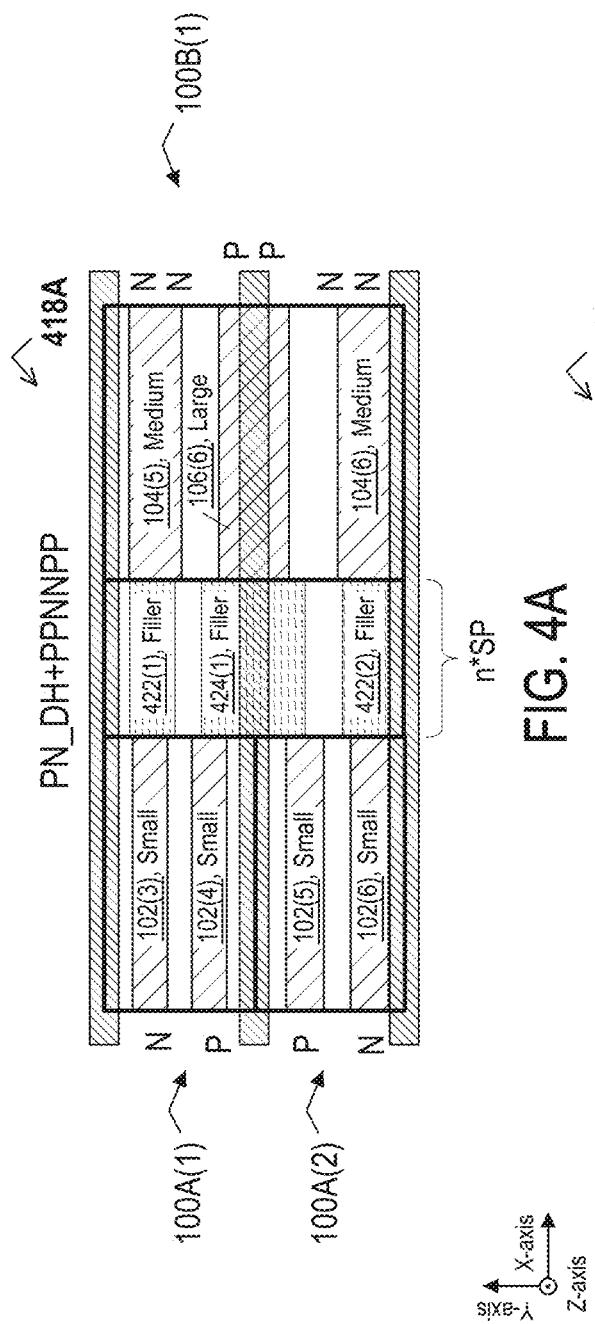
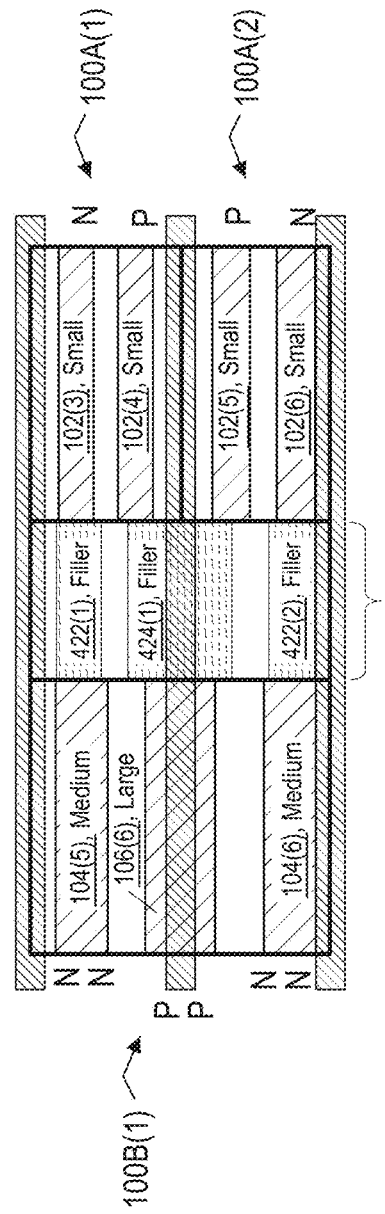
FIG. 4A
FIG. 4B

US 12,557,394 B2

DEVICE HAVING HYBRID CELL REGIONS AND METHOD OF MANUFACTURING SAME

PRIORITY

The present application claims the priority of U.S. Provisional Application No. 63/484,680, filed Feb. 13, 2023, which is incorporated herein by reference in its entirety.

BACKGROUND

The semiconductor integrated circuit (IC) industry produces a wide variety of analog and digital devices to address issues in a number of different areas. Developments in semiconductor process technology nodes have progressively reduced component sizes and tightened spacing resulting in progressively increased transistor density. ICs have become smaller.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 1A-1E are corresponding layout diagrams of cell regions for semiconductor devices, in accordance with some embodiments.

FIGS. 2A-2F are layout diagrams of corresponding cell regions for semiconductor devices, in accordance with some embodiments.

FIGS. 4A-4C are layout diagrams of corresponding cell regions for semiconductor devices, in accordance with some embodiments.

DETAILED DESCRIPTION

Figure 2F:
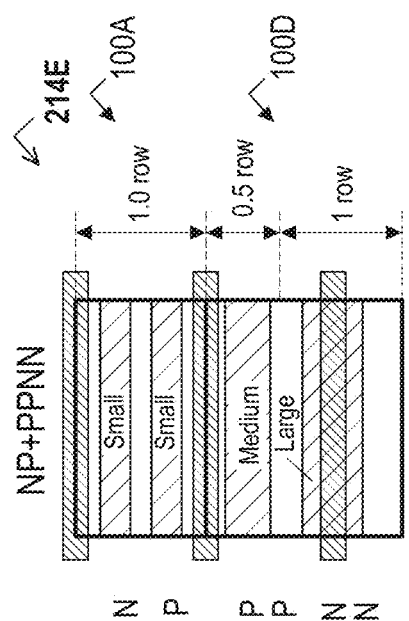

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for case of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a cell region of a semiconductor device includes: active regions (ARs) formed as predetermined shapes on a substrate including first and second ARs having a first shape and correspondingly first and second dopant types, a third AR having a second shape and the second dopant type, and a fourth AR having a third shape and the first dopant type. The first and second ARs are arranged in a first area of the cell region. The third and fourth ARs are arranged in a second area of the cell region. The second area is adjacent to the first area relative to a first direction (e.g., Y-axis (vertical adjacency-architecture) or X-axis (horizontal adjacency-architecture)). The first shape is smaller than the second shape. The second shape is smaller than the third shape. Such a cell region is a hybrid cell region that includes some higher speed (of operation) and larger area circuits in combination with some lower speed (of operation) and smaller area circuits that achieves an improved speed of operation without suffering a relative large increase of area.

FIGS. 1A-1E are layout diagrams of corresponding cell regions 100A-100E for semiconductor devices, in accordance with some embodiments.

Cell regions 100A-100E are building blocks which are combined to form larger cell regions, e.g., the cell regions of FIGS. 2A-2F, 4A-4C, or the like. In some embodiments, cell regions 100A-100E are referred to as kernel cell regions whereas larger cell regions formed from combinations of kernel cell regions 100A or 100B or 100C or 100D or 100E are referred to as combination cell regions. In FIGS. 1A-1E, and likewise in other figures in the present document, it is assumed that first, second and third orthogonal directions are, e.g., correspondingly parallel to the X-axis, Y-axis and Z-axis.

In FIGS. 1A-1E, and for likewise in other figures in the present document, a numbering convention is assumed in which the first layer of metallization, namely MET_1st, is labeled as M0, and correspondingly a first layer of interconnection (VIA_1st layer) is VIA_0. In some embodiments, depending upon the numbering convention of the corresponding process node by which a semiconductor device is manufactured, the MET_1st layer is MI and correspondingly the VIA_1st layer is VIA1.

Taken together, cell regions 100A-100E include active regions (ARs) of different sizes relative to each other. To connote at least some of the relative size differences, the ARs include what is referred to herein as small, medium and large ARs. Long axes of the ARs are parallel to the X-axis. In the present document, size relative to the X-axis is referred to as width, size relative to the Y-axis is referred to as height, and the product of length multiplied by width of the ARs is referred to as area. For simplicity of illustration, relative to the X-axis, FIGS. 1A-1E (and likewise other figures in the present document) assume that widths of the small, medium and large ARs are the same for each of cell regions 100A-100E. Accordingly, the area relations of small AR versus medium AR versus large AR depends upon the height of the active regions relative to the Y-axis. The height of the small AR, h_Sm, the height of the medium AR, h_Med, and the height of the large AR, h_Lrg, relate to each other as h_Sm<h_Med<h_Lrg. Accordingly, the area of the small AR, area_Sm, the area of the medium AR, area_Med, and the area of the large AR, area_Lrg, relate to each other as area_Sm<area_Med<area_Lrg.

In FIG. 1A, single-height rows 110(1) and 110(2) extend parallel the X-axis. Together, single-height rows 110(1) and 110(2) represent a double-height row 112(1). The height of cell region 100A, h_100A, is the same as the height of a single-height row, h_row, i.e., h_100A=1*h_row.

A height of the small AR, h_Sm, is equal to one HAR, i.e., h_Sm=1*HAR, where HAR is a unit of height of the corresponding process node by which a device based on one or more cell regions 100A-100E is manufactured. In some embodiments, relative to a height of cell region 100A, h_100A, the height of the small AR is in a range ($\approx$13%*h_100A)$\leq$h_Sm$\leq$($\approx$23%*h_100A). In some embodiments, relative to the height of the small AR, the height of the medium AR, h_Med, is in a range ($\approx$1.2*h_Sm)$\leq$h_Med$\leq$($\approx$1.7*h_Sm). In some embodiments, relative to the height of the small AR, the height of the large AR, h_Lrg, is in a range ($\approx$1.8*h_Sm)$\leq$h_Lrg$\leq$($\approx$3.2*h_Sm).

In FIG. 1A, cell region 100A includes a small AR 102(1) stacked on a small AR 102(2) relative to the Y-axis. FIG. 1A assumes that small AR 102(1) is doped with a P-type dopant and small AR 102(2) is doped with an N-type dopant, as indicated in FIG. 1A. Cell region 100A is described as a PN cell region. In some embodiments, the converse is true, i.e., small AR 102(1) is doped with an N-type dopant and small AR 102(2) is doped with a P-type dopant, and cell region 100A is described as an NP cell region.

In FIG. 1A, cell region 100A includes MO segments that have long axes parallel to the X-axis including MO segments 108(1) and 108(2) that represent instances of power rails (PRs) that comprise a power grid (PG). Relative to the Y-axis, PR 108(1) overlies a top boundary of cell region 100A and PR 108(2) overlies a bottom boundary of cell region 100A. Relative to the Y-axis, each of small AR 102(1) and small AR 102(2) is free from being overlapped by an instance of the PR. PR 108(1) is substantially collinear with a top boundary of row 110(2). PR 108(2) is substantially collinear with a bottom boundary of row 110(2). In some embodiments, PR 108(1) provides a first reference voltage, e.g., VDD, and PR 108(2) provides a second reference voltage, e.g., VSS. In some embodiments, the converse is true, PR 108(1) provides VSS and PR 108(2) provides VDD. Relative to the Y-axis, a midline-to-midline distance between adjacent PRs, e.g., PRs 108(1) and 108(2), is referred to herein as PR pitch, p_PR, and is equal to the height of a single row, i.e., p_PR=1*h_row. More generally, relative to Y-axis, adjacent PRs have pitch p_PR.

In FIG. 1B, cell region 100B includes a medium AR 104(1), a large AR 106(1) and a medium AR 104(2). Relative to the Y-axis, large AR 106(1) is between medium ARs 104(1) and 104(2). FIG. 1B assumes that medium ARs 104(1) and 104(2) are doped with a P-type dopant and large AR 106(1) is doped with an N-type dopant, as indicated in FIG. 1B. Because of the larger area of each of the medium AR (e.g., 104(1) and 104(2)) and the large AR (e.g., 106(1)) as compared to the small AR (e.g. 102(1) and 102(2) of FIG. 1A), cell region 100B is described as a PPNNPP cell region. In some embodiments, the converse is true, i.e., medium ARs 104(1) and 104(2) are doped with an N-type dopant and large AR 106(1) is doped with a P-type dopant, and cell region 100B is described as an NNPPNN cell region. The height of cell region 100B, h_100B, is the same as the height of a double-height row, e.g., row 112(1) such that h_100B=2*h_row.

In FIG. 1B, cell region 100B includes PRs 108(3), 108(4) and 108(5). Relative to the Y-axis: PR 108(3) overlies a top boundary of cell region 100B; PR 108(4) overlies a central portion of cell region 100B; and PR 108(5) overlies a bottom boundary of cell region 100A. Relative to the Y-axis: each of PR 108(3) and PR 108(5) is free from overlapping medium AR 104(1), large AR 106(1) or medium AR 104(2); and PR 108(4) overlies a central portion of large AR 106(1). PR 108(3) is substantially collinear with a top boundary of row 112(1), which is the same as the top boundary of row 110(1). PR 108(4) is substantially collinear with a bottom boundary of row 110(1), which is the same as a top boundary of row 110(2). PR 108(5) is collinear with a bottom boundary of row 112(1), which is the same as a bottom boundary of row 110(2). In some embodiments, PRs 108(3) and 108(5) provide VSS, and PR 108(4) provides VDD. In some embodiments, the converse is true, PRs 108(3) and 108(5) provide VDD and PR 108(4) provides VDD.

In FIG. 1C, cell region 100C includes a large AR 106(2) and a large AR 106(3). FIG. 1C assumes that large AR 106(2) is doped with a P-type dopant and large AR 106(3) is doped with an N-type dopant, as indicated in FIG. 1C. Cell region 100C is described as a PPNN cell region. In some embodiments, the converse is true, i.e., large AR 106(2) is doped with an N-type dopant and large AR 106(3) is doped with a P-type dopant, and cell region 100C is described as an NNPP cell region. The height of cell region 100C, h_100C, is two rows or double height, i.e., h_100C=2*h_row.

In FIG. 1C, cell region 100C includes PRs 108(6) and 108(7). Relative to the Y-axis: PR 108(6) overlies a central region of large AR 106(2); and PR 108(7) overlies a central region of large AR 106(3). PR 108(6) is collinear with a reference line that extends parallel to the X-axis and which represents a vertical midline of row 110(1) relative to the Y-axis. PR 108(7) is collinear with a reference line that extends parallel to the X-axis and which represents a vertical midline of row 110(2) relative to the Y-axis. Relative to the Y-axis, each of a top boundary, a bottom boundary and a middle portion of cell region 100C is free from being overlapped by an instance of the PR. In some embodiments, PR 108(6) provides VDD, and PR 108(7) provides VSS. In some embodiments, the converse is true, PR 108(6) provides VSS and PR 108(7) provides VSS.

In FIG. 1D, cell region 100D includes a medium AR 104(3) stacked on a large AR 106(4). FIG. 1D assumes that medium AR 104(3) is doped with a P-type dopant and large AR 106(4) is doped with an N-type dopant, as indicated in FIG. 1D. Cell region 100D is described as a PPNN cell region. In some embodiments, the converse is true, i.e., medium AR 104(3) is doped with an N-type dopant and large AR 106(4) is doped with a P-type dopant, and cell region 100D is described as an NNPP cell region. The height of cell region 100D, h_100D, is 1.5 rows, i.e., h_100D=1.5*h_row.

In FIG. 1D, cell region 100D includes PRs 108(8) and 108(9). Relative to the Y-axis: PR 108(8) overlies the top boundary of cell region 100D; and PR 108(9) overlies a central region of large AR 106(4). PR 108(8) is collinear with a reference line that extends parallel to the X-axis and which represents a vertical midline of row 110(3) relative to the Y-axis. PR 108(9) is collinear with a reference line that extends parallel to the X-axis and which represents a vertical midline of row 110(4) relative to the Y-axis. Together, single-height rows 110(3) and 110(4) represent a double-height row 112(2).

In cell region 100D, a bottom boundary of medium AR 104(3) is substantially collinear with a bottom boundary of row 110(3), where the bottom boundary of row 110(3) is the same as a top boundary of row 110(4) and a vertical midline of row 112(2). Relative to the Y-axis, each of medium AR 104(3), a bottom boundary of cell region 100D and a middle portion of cell region 100D is free from being overlapped by an instance of the PR. In some embodiments, PR 108(8) provides VDD and PR 108(9) provides VSS. In some embodiments, the converse is true, PR 108(8) provides VSS and PR 108(9) provides VDD.

In FIG. 1E, cell region 100E includes a large AR 106(5) stacked on a medium AR 104(4). FIG. 1E assumes that large AR 106(5) is doped with an N-type dopant and medium AR 104(4) is doped with a P-type dopant, as indicated in FIG. 1E. Cell region 100E is described as an NNPP cell region. In some embodiments, the converse is true, i.e., large AR 106(5) is doped with an P-type dopant and medium AR 104(4) is doped with a N-type dopant, and cell region 100E is described as a PPNN cell region. The height of cell region 100E, h_100E, is 1.5 rows, i.e., h_100E=1.5*h_row.

In FIG. 1E, cell region 100E includes PRs 108(10) and 108(11). Relative to the Y-axis, PR 108(10) overlies a central region of large AR 106(5) and is collinear with a vertical midline of row 110(3). PR 108(11) is collinear with the vertical midline of row 110(4) relative to the Y-axis. A top boundary of medium AR 104(4) is proximal to the vertical midline of row 112(2), where the vertical midline of row 112(2) is the same as the bottom boundary of row 110(3) and the top boundary of row 110(4). Relative to the Y-axis, each of medium AR 104(4), a top boundary of cell region 100E and a middle portion of cell region 100E is free from being overlapped by an instance of the PR. In some embodiments, PR 108(8) provides VSS, and PR 108(9) provides VDD. In some embodiments, the converse is true, PR 108(8) provides VDD and PR 108(9) provides VSS.

FIGS. 2A-2F are layout diagrams of corresponding cell regions 214A-214F of semiconductor devices, in accordance with some embodiments.

Cell regions 214A-214F are referred to as combination cell regions because they are corresponding combinations of kernel cell regions 100A-100E of FIGS. 1A-1E. Each of cell regions 214A-214F is an example of an adjacency-architecture relative to the Y-axis, i.e., a vertical adjacency-architecture. Each of cell regions 214A-214F is a corresponding stack, relative to the Y-axis, of cell regions 100A-100F of FIGS. 1A-1F.

In FIG. 2A, cell region 214A is a combination of cell region 100A stacked on cell region 100B relative to the Y-axis. Cell region 100A is adjacent to cell region 100B relative to the Y-axis. In cell region 214A, cell regions 100A and 100B are free from being separated from each other by one or more dummy ARs relative to the Y-axis. The height of cell region 214A, h_214A, is the sum of the heights of cell regions 100A and 100B such that h_214A=h_100A+h_100B=3*h_row. Cell region 214A is described as a PN+PPNNPP cell region.

In FIG. 2B, cell region 214B is similar to cell region 214A of FIG. 2A. For brevity, the discussion will focus more on differences between FIG. 2B and FIG. 2A than on similarities. Whereas cell region 100A is stacked on cell region 100B in FIG. 2A, cell region 214B of FIG. 2B is a combination of cell region 100B stacked on cell region 100A relative to the Y-axis. Cell region 214B is described as a PPNNPP+PN cell region.

In FIG. 2C, cell region 214C is a combination of cell region 100A stacked on cell region 100C relative to the Y-axis. Cell region 100A is adjacent to cell region 100C relative to the Y-axis. In cell region 214C, cell region 100A is separated from cell region 100C by a filler region 216(1) relative to the Y-axis. In some embodiments, filler region 216(1) includes an AR region doped with an N-type dopant. In some embodiments, the use of the N-type dopant for the AR region of filler region 216(1) is to achieve a better balance of N-type dopants and P-type dopants in cell region 214C as a whole. In some embodiments, filler region 216(1) includes dummy transistors each of which has a shorted-configuration (shorted-transistor), the shorted-transistor including a gate electrode, a first source/drain (S/D) region and a second S/D region which are coupled together.

The height of filler region 216(1), h_216(1), is half of a single-height row such that h_216_1=(½)*h_row. In some embodiments, the inclusion of filler region 216(1) is for purposes of preserving the uniformity of the PR pitch, p_PR. The height of cell region 214A, h_214A, is the sum of the heights of cell regions 100A and 100B such that h_214A=h_100A+h_216_1+h_100B=2.5*h_row. Cell region 214C is described as a PN+PPNN cell region.

In FIG. 2D, cell region 214D is similar to cell region 214C. For brevity, the discussion will focus more on differences between FIG. 2D and FIG. 2C than on similarities. Whereas cell region 100A is stacked on cell region 100C in FIG. 2C, cell region 214D of FIG. 2D is a combination of cell region 100C stacked on cell region 100A with a filler region 216(2) therebetween relative to the Y-axis. In some embodiments, filler region 216(2) includes an AR region doped with a P-type dopant. In some embodiments, the use of the P-type dopant for the AR region of filler region 216(2) is to achieve a better balance of N-type dopants and P-type dopants in cell region 214D as a whole. Cell region 214D is described as a PPNN+PN cell region.

Figure 2E:
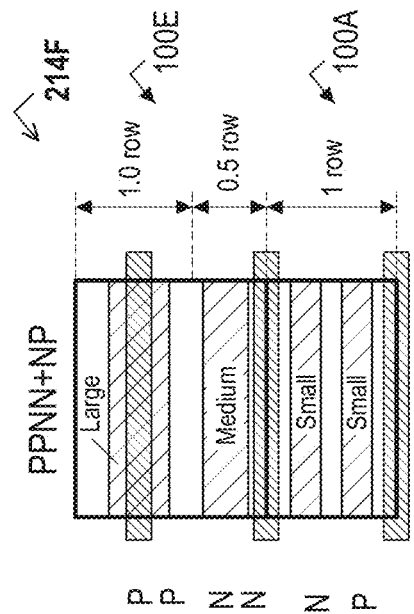

In FIG. 2E, cell region 214E is a combination of cell region 100A stacked on cell region 100D relative to the Y-axis. Cell region 100A is adjacent to cell region 100D relative to the Y-axis. In cell region 214E, cell regions 100A and 100D are free from being separated from each other by one or more dummy ARs relative to the Y-axis.

The height of cell region 214E, h_214E, is the sum of the heights of cell regions 100A and 100D such that h_214E=h_100A+h_100E=2.5*h_row. Cell region 214E is described as an NP+PPNN cell region.

In FIG. 2F, cell region 214F is similar to cell region 214E. For brevity, the discussion will focus more on differences between FIG. 2F and FIG. 2E than on similarities. Whereas cell region 100A is stacked on cell region 100D in FIG. 2E, cell region 214E of FIG. 2F is a combination of cell region 100D stacked on cell region 100A. Cell region 214A is described as a PPNN+NP cell region.

Figure 3A:
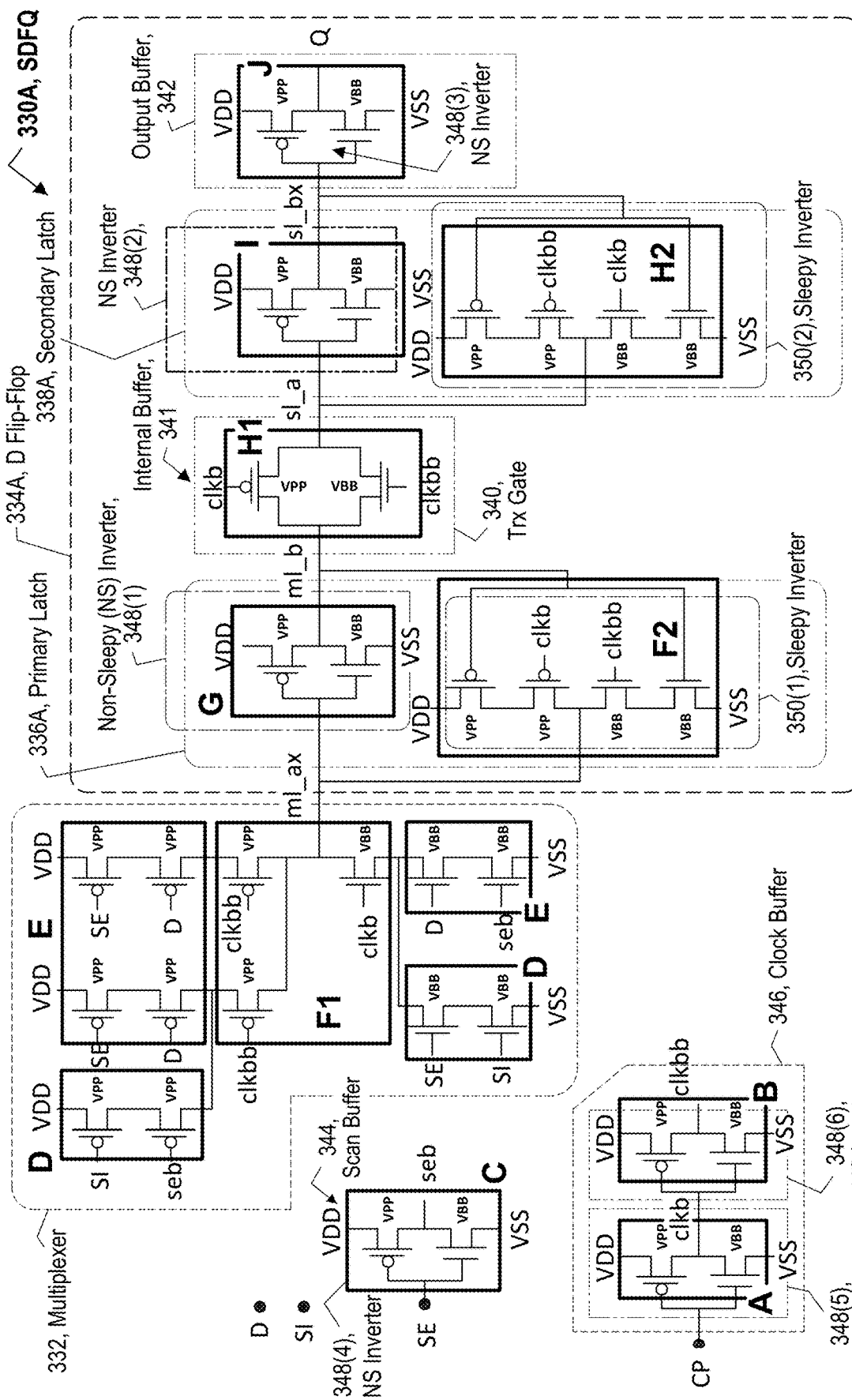
FIGS. 3A and 3C are schematic diagrams of corresponding flip-flop circuits, in accordance with some embodiments.
Figure 3B:
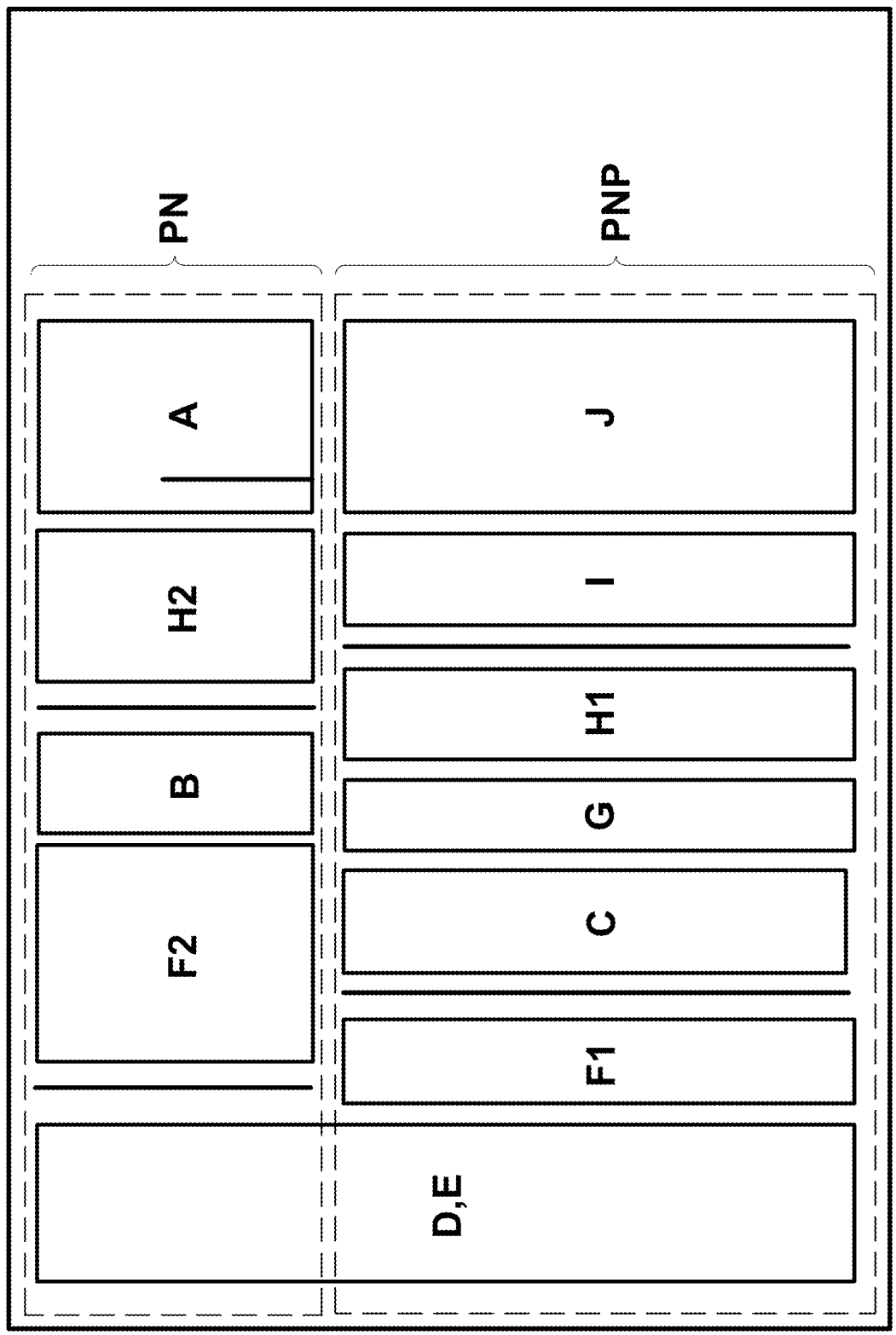
FIGS. 3B and 3D are layout diagrams of corresponding flip-flop circuits, in accordance with some embodiments.

FIG. 3A is a schematic circuit diagram, in accordance with some embodiments. FIG. 3B is a layout diagram corresponding to the circuit of FIG. 3A, in accordance with some embodiments.

More particularly, FIG. 3A is a schematic circuit diagram of a scan-insertion D flip-flop (SDFQ) 330A. SDFQ 330B of FIG. 3B corresponds to SDFQ 330A of FIG. 3A. Groups of transistors (discussed below) in FIG. 3A are denoted by polygons/blocks which correspond to zones in FIG. 3B.

SDFQ 330A is a transmission-gate-based design (discussed below). SDFQ 330A is an edge-triggered arrangement that is triggered on a rising edge (positive edge) of a clock signal. Variations of SDFQ 330A are triggered on the falling edge (negative edge) of the clock signal. Other variations of SDFQ 330A are double edge-triggered, i.e., are trigged by both the rising edge (positive edge) and falling edge (negative edge) of the clock signal.

SDFQ 330A includes a multiplexer 332, a D flip-flop 334A, a scan buffer 344 and a clock buffer 346. SDFQ 330A includes field-effect transistors (FETs), and more particularly, positive-channel metal oxide semiconductor (PMOS) FETs (PFETs) and negative-channel metal oxide semiconductor (NMOS) FETs (NFETs). Some of the FETs of SDFQ 330A are arranged to function together as sleepy inverters (discussed below). Some of the FETs of SDFQ 330A are arranged to function together as non-sleepy (NS) inverters (discussed below).

In FIG. 3A, scan buffer 344 receives a Scan/Test Enable (SE) signal that selects between normal, i.e., non-scan/test, operation relative to data signal D or scan/test operation relative to a Scan Input (SI) signal. Scan buffer 344 includes a non-sleepy (NS) inverter 348(4), the latter including series-connected PFET and NFET. An NS inverter, e.g., 348(4) is a counterpart to a sleepy inverter, e.g., 350(1) (discussed below). Scan buffer 344 corresponds to zone C in FIG. 3B.

In FIG. 3A, clock buffer 346 includes a pair of series-coupled NS inverters 348(5) and 348(6). NS inverters 348(5) and 348(6) correspond to zones A and B in FIG. 3B. Clock buffer 346 is configured to receive a clock signal CP and output a clock signal clkb which represents the inversion of clock signal CP and a clock signal clkbb which represents the inversion of clock signal clkb.

In FIG. 3A, multiplexer 332 includes groups of transistors corresponding to zones D, E and F1 in FIG. 3B. Multiplexer 332 is configured to receive a scan input signal SI, signal seb, data input signal D, signal SE, signal clkbb, and signal clkb. Multiplexer 332 is used for selecting data input signal D or scan input signal SI.

In FIG. 3A, D flip-flop 334A includes a primary latch 336A, an internal buffer 341, a secondary latch 338A and an output buffer 342. Primary latch 336A includes: an NS inverter 348(1) corresponding to zone G in FIG. 3B; and a sleepy inverter 350(1) corresponding to zone F2 in FIG. 3B. Primary latch 336A is configured to receive signal m1_ax from multiplexer 332. As such, signal m1_ax represents the input signal of D flip-flop 334A. An output node of primary latch 336A has a signal m1_b which represents the inversion of signal m1_ax. In primary latch 336A, sleepy inverter 350(1) can be put into a sleep mode of operation due to the inclusion of extra transistors as compared to NS inverter 348(1). By contrast, NS inverter 348(1) lacks the extra transistors of sleepy inverter 350(1) such that inverter 348(1) of primary latch 336A lacks a sleep mode of operation; accordingly, NS inverter 348(1) is described as a non-sleepy (NS) inverter.

In FIG. 3A, internal buffer 341 includes a transmission gate 340 corresponding to zone H1 in FIG. 3B. Describing SDFQ 330A as a transmission-gate-based design is informed by the inclusion of transmission gate 340 in internal buffer 341. Internal buffer 341 receives signal clkbb and outputs a signal s1_a. Secondary latch 338A includes: an NS inverter 348(2) corresponding to zone I in FIG. 3B; and a sleepy inverter 350(2) corresponding to zone H2 in FIG. 3B. Secondary latch 338A is configured to receive signal s1_a and output a signal s1_bx which represents the inversion of signal s1_a.

In D flip-flop 334A, output buffer 342 includes an NS inverter 348(3) corresponding to zone J in FIG. 3A. Output buffer 342 is configured to receive signal s1_bx and amplify the same such that the output of D flip-flop 334A is signal s1_bx. Furthermore, the output of D flip-flop 334A also is the output of SDFQ 330A.

In FIG. 3A, D flip-flop 334A is a transmission-gate-based design because internal buffer 341 thereof includes transmission gate 340. In some embodiments, D flip-flop 334A is a stack-gate-based design (not shown). More particularly, whereas internal buffer 341 of FIG. 3A includes transmission gate 340, a stack-gate-based version of D flip-flop 334A includes a version of internal buffer 341 which is stack-gate-based. In some embodiments, the stack-gate-based version of internal buffer 341 includes a sleepy inverter (not shown) in place of transmission gate 340, where a sleepy inverter is an example of a stack-gate-based device. Like transmission gate 340, the output of the alternative sleepy inverter is coupled to the input of secondary latch 338A. In contrast to transmission gate 340, the input of the alternative sleepy inverter in the stack-gate-based device is not connected to the output of primary latch 336 A but instead is connected to the output of multiplexer 332.

SDFQ 330B of FIG. 3B is divided into a section having the PN architecture of FIG. 1A and a section having the PPNNPP architecture of FIG. 1C. Relative to the Y-axis, the PN section of FIG. 3B is stacked on the PPNNPP section of FIG. 3B. Accordingly, SDFQ 330B has the PN+PPNNPP architecture of cell region 214A of FIG. 2A.

In FIG. 3B, zones have been marked to denote corresponding groups of transistors in SDFQ 330A of FIG. 3A. Zones F2, B, H2 and A are in the PN section of FIG. 3B. Zones D, E, F1, C, G, H1, I and J are in the PPNNPP section of FIG. 3B.

Figure 3C:
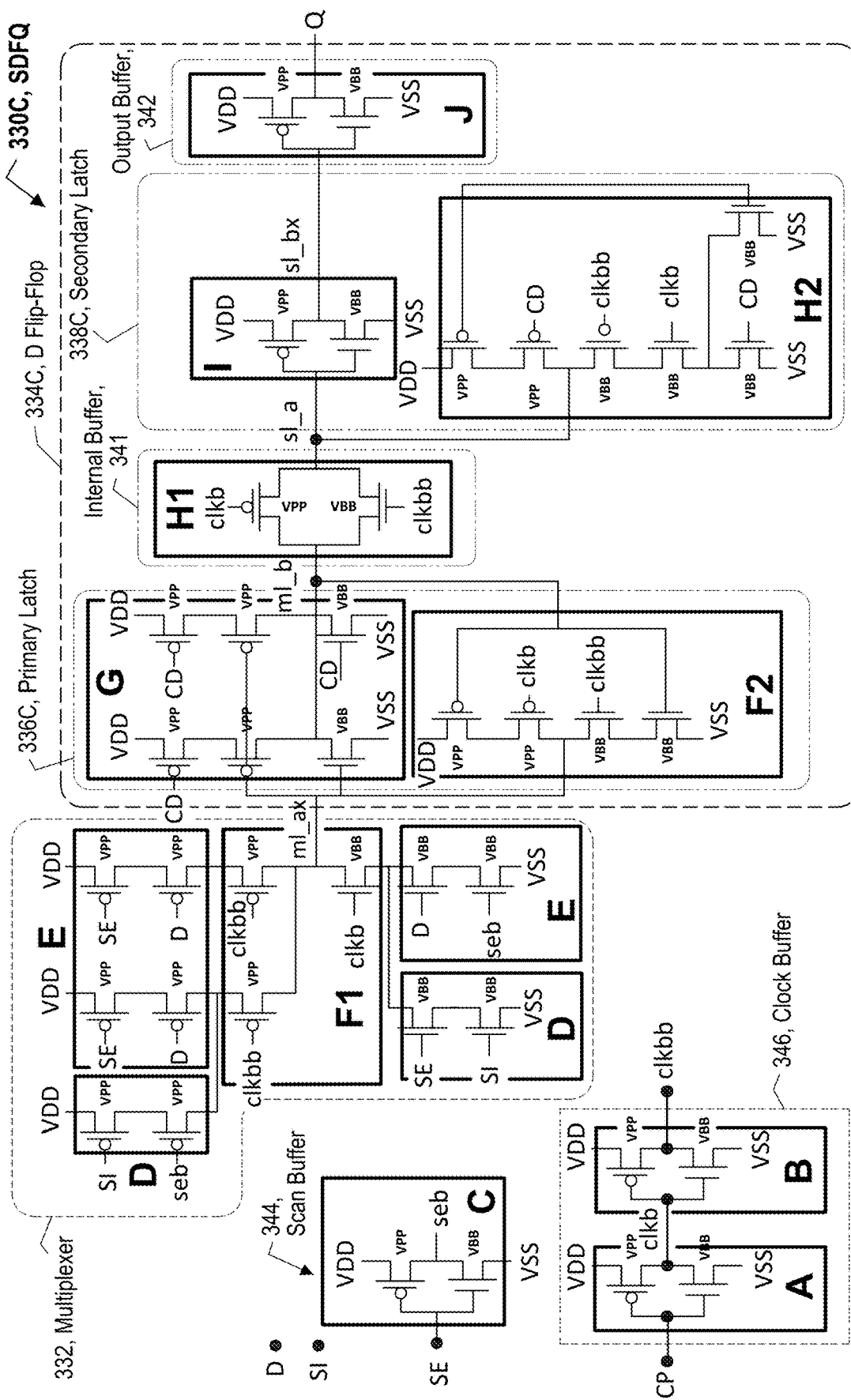
Figure 3D:
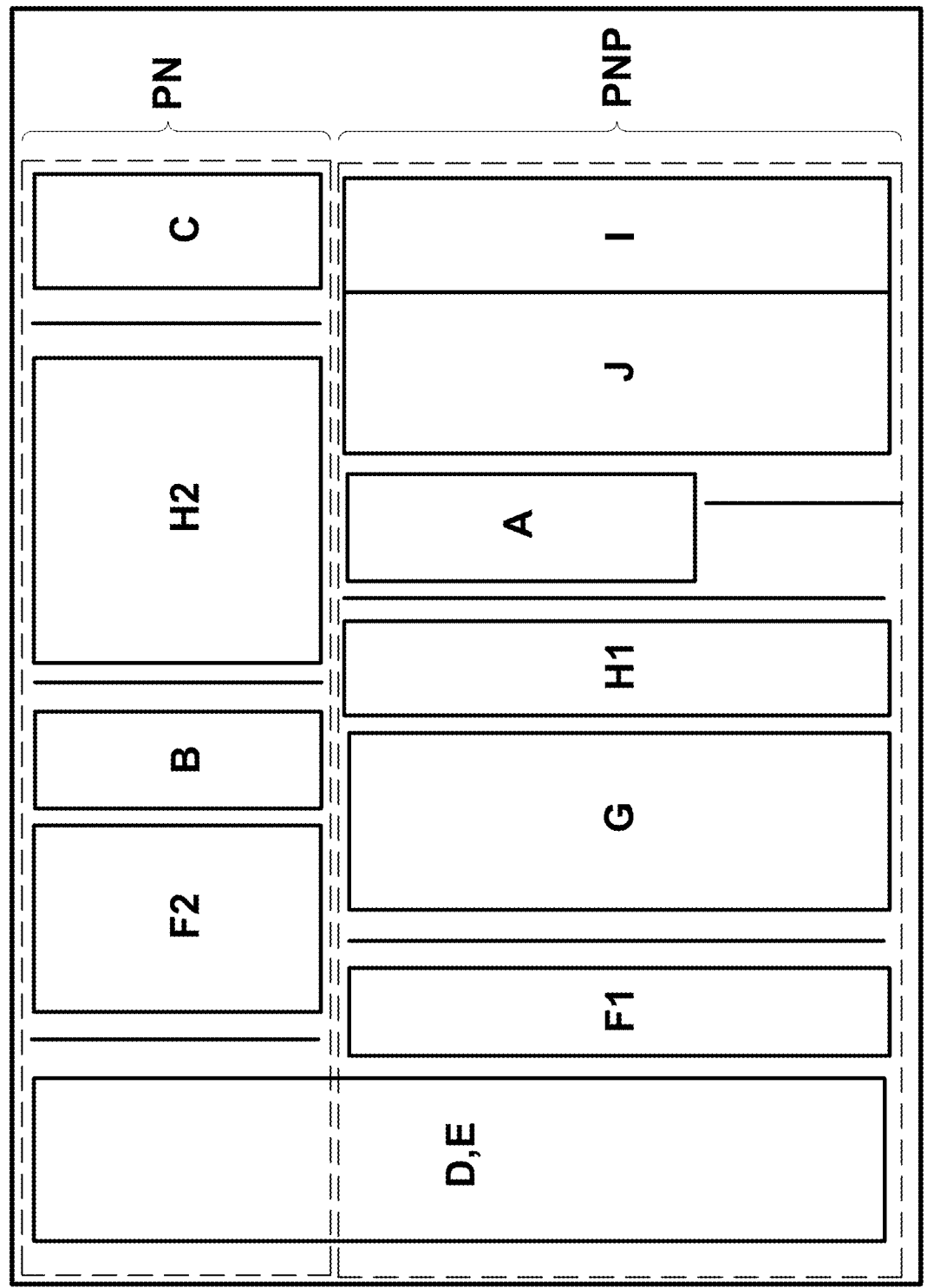

FIG. 3C is a schematic circuit diagram, in accordance with some embodiments. FIG. 3D is a layout diagram corresponding to the circuit of FIG. 3C, in accordance with some embodiments.

More particularly, FIG. 3C is a schematic circuit diagram of a scan-insertion D flip-flop (SDFQ) 330C. SDFQ 330D of FIG. 3D corresponds to SDFQ 330C of FIG. 3C. SDFQ 330C is similar to SDFQ 330A. For brevity, the discussion will focus more on differences between FIG. 3C and FIG. 3A than on similarities. Groups of transistors (discussed below) in FIG. 3C are denoted by polygons/blocks which correspond to zones in FIG. 3D. The groups of transistors vary somewhat in FIG. 3C as compared to FIG. 3B.

SDFQ 330C includes multiplexer 332, a D flip-flop 334C, a scan buffer 344 and a clock buffer 346. D flip-flop 334C includes a primary latch 336C, internal buffer 341, a secondary latch 338C and output buffer 342. Primary latch 336C includes: an NS inverter corresponding to zone G in FIG. 3D; and a sleepy inverter corresponding to zone F2 in FIG. 3D. The number of transistors and the configuration thereof in the NS inverter (zone G) of FIG. 3C is different than for NS inverter 348(1) of FIG. 3A.

Secondary latch 338C includes: an NS inverter corresponding to zone I in FIG. 3D; and a sleepy inverter corresponding to zone H2 in FIG. 3D. The number of transistors and the configuration thereof in the sleepy inverter (zone H2) of FIG. 3C is different than for the sleepy inverter 350(2) of FIG. 3A.

SDFQ 330D of FIG. 3D is divided into a section having the PN architecture of FIG. 1A and section having the PPNNPP architecture of FIG. 1C. Relative to the Y-axis, the PN section of FIG. 3D is stacked on the PPNNPP section of FIG. 3D. Accordingly, SDFQ 330D has the PN+PPNNPP architecture of cell region 214A of FIG. 2A.

In FIG. 3D, zones have been marked to denote corresponding groups of transistors in SDFQ 330C of FIG. 3C. Zones F2, B, H2 and C are in the PN section of FIG. 3D. Zones D, E, F1, G, H1, A, J and I are in the PPNNPP section of FIG. 3D.

Figure 4C:
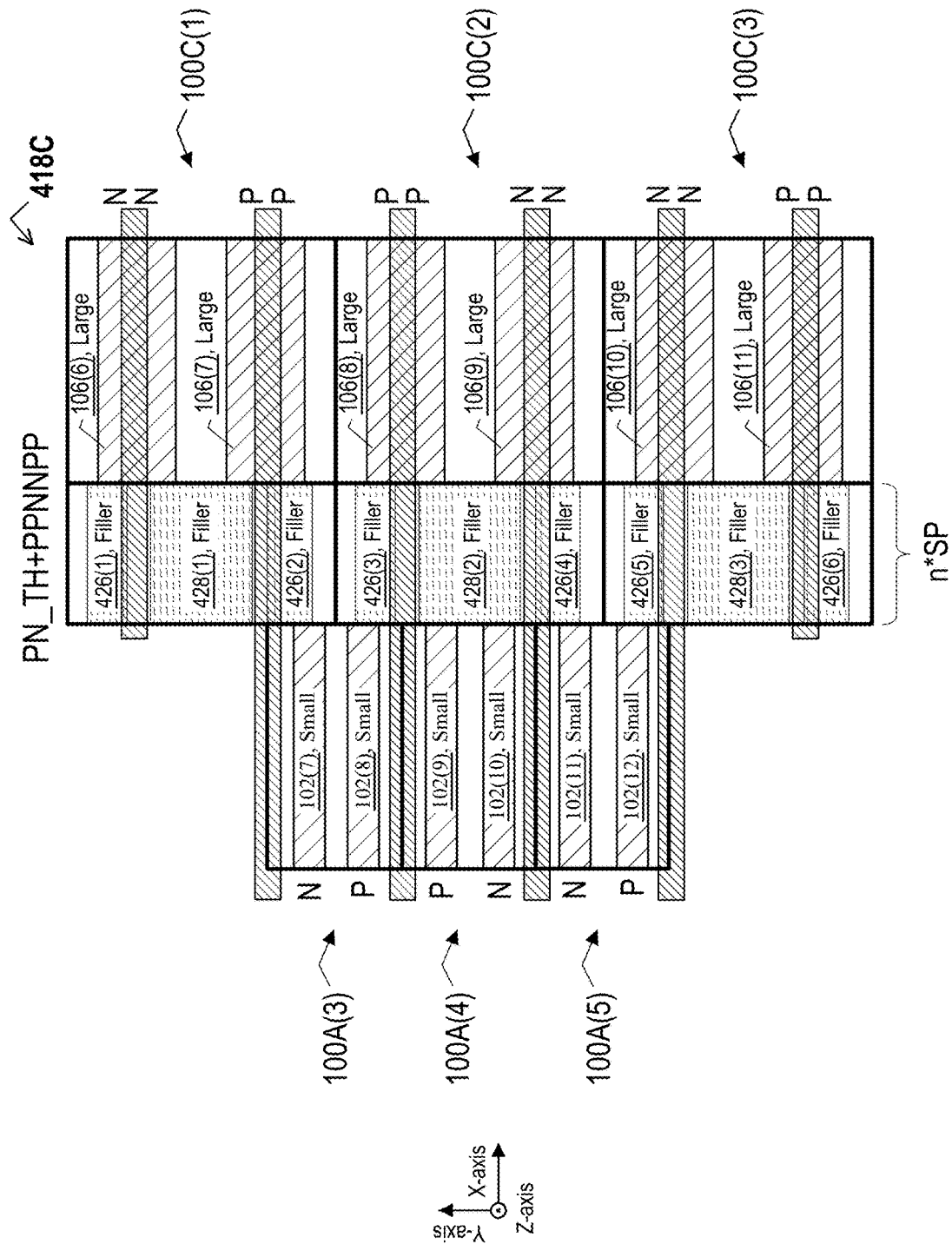

FIGS. 4A-4C are layout diagrams of corresponding cell regions 418A-418C of semiconductor devices, in accordance with some embodiments.

Cell regions 418A-418C are referred to as combination cell regions because they are corresponding combinations of kernel cell regions 100A-100C of FIGS. 1A-1C. Each of cell regions 418A-418C is an example of an adjacency-architecture relative to the X-axis, i.e., a horizontal adjacency-architecture.

In FIG. 4A, cell region 418A includes: cell regions 100A(1) and 100A(2), each of which is an example of cell region 100A of FIG. 1A; and cell region 100B. That is, cell region 418A is a combination of cell regions 100A(1), 100A(2) and 100B.

Each of cell regions 100A(1) and 100A(2) is arranged adjacently to cell region 100B relative to the X-axis, which is why cell region 418A is described as example of a horizontal adjacency-architecture. Cell regions 100A(1) is stacked on cell region 100A(2) relative to the Y-axis; in this respect, cell region 418A also is an example of a vertical adjacency-architecture. Cell region 100A(1) includes a small AR 102(3) stacked on small AR 102(4) relative to the Y-axis. Cell region 100A(2) includes small AR 102(5) stacked on small AR 102(6) relative to the Y-axis. Cell regions 100A(1) and 100A(2) are free from being separated from each other by one or more dummy ARs relative to the Y-axis.

In FIG. 4A, relative to the X-axis, cell regions 100A(1) and 100A(2) are separated from cell region 100B by filler regions. Small AR 102(3) is separated from medium AR 104(5) by a filler region 422(1). Small AR 102(4) is separated from large AR 106(6) by a filler region 424(1). Filler region 424(1) also separates small AR 102(5) from large AR 106(6). Small AR 102(6) is separated from medium AR 104(6) by a filler region 422(1).

In some embodiments, filler region 422(1) includes an AR region doped with an N-type dopant. In some embodiments, filler region 422(2) includes an AR region doped with an N-type dopant. In some embodiments, filler region 424(1) includes an AR region doped with a P-type dopant. In some embodiments, one or more of filler regions 422(1), 422(2) and 424(1) includes dummy transistors each of which has a shorted-configuration (shorted-transistor), the shorted-transistor including a gate electrode, a first source/drain (S/D) region and a second S/D region which are coupled together.

The height of cell region 418A, h_418A, is the same as the height of cell region 100B(1) such that h_418A=h_100B(1)=2.5*h_row. Cell region 214A is described as a PN_DH+ PPNNPP cell region, where DH indicates double height, and where PN_DH indicates the stack of cell region 100A(1) on cell region 100A(2).

Each of filler regions 422(1), 422(2) and 424(1) has a width, w_fill, where w_fill is a multiple of a standard spacing, SP, for the corresponding semiconductor process technology node such that w_fill=n*SP, and where n is a positive integer. In some embodiments, the standard spacing SP represents one contacted poly pitch (CPP) for the corresponding semiconductor process technology node. Here, the word 'poly' in the term CPP does not necessarily imply that gate structures in semiconductor devices based correspondingly on FIG. 4A are to be formed of polysilicon but instead represents a historical convenience, i.e., because gate structures in ICs manufactured according to a predecessor semiconductor process technology node often were formed of polysilicon.

Relative to the X-axis, there is a step-transition (or jog), when transitioning from an AR to a filler region and when transitioning from a filler region to an AR region. The size of the transition is relative to the Y-axis. The heights of the filler regions of FIG. 4A are selected to reduce the magnitude of the step-transitions (or jogs). Relative to the Y-axis, the height of each of filler regions 422(1) and 422(2) is the same, h_422, and is less than the height of filler region 424(1), h_424, such that h_422<h_424.

In FIG. 4B, cell region 418B is similar to cell region 418A of FIG. 4A. For brevity, the discussion will focus more on differences between FIG. 4B and FIG. 4A than on similarities. Whereas stacked cell regions 100A(1) and 100A(2) are to the left of cell region 100B(1) in FIG. 4A, stacked cell regions 100A(1) and 100A(2) are to the right of cell region 100B(1) in FIG. 4A.

In FIG. 4C, cell region 418C includes: cell regions 100A(3), 100A(4) and 100A(5), each of which is an example of cell region 100A of FIG. 1A; and cell regions 100C(1), 100C(2) and 100C(3), each of which is an example of cell region 100C of FIG. 1C. That is, cell region 418C is a combination of cell regions 100A(3), 100A(4), 100A(5), 100C(1), 100C(2) and 100C(3). Cell region 418C further includes filler regions 426(1)-426(6) and 428(1)-428(3).

Each of cell regions 100A(3), 100A(4) and 100A(5) is arranged adjacently to cell regions 100C(1), 100C(2) and 100C(3) relative to the X-axis, which is why cell region 418C is described as example of a horizontal adjacency-architecture. Cell region 100A(3) is stacked on cell region 100A(4), and cell region 100A(4) is stacked on cell region 100A(5), relative to the Y-axis; in this respect, cell region 418A also is an example of a vertical adjacency-architecture. Cell region 100C(1) is stacked on cell region 100C(2), and cell region 100C(2) is stacked on cell region 100C(3), relative to the Y-axis; in this respect, cell region 418A also is an example of a vertical adjacency-architecture.

Cell region 100A(3) includes small AR 102(7) stacked on small AR 102(8) relative to the Y-axis. Cell region 100A(4) includes small AR 102(9) stacked on small AR 102(10) relative to the Y-axis. Cell region 100A(5) includes small AR 102(11) stacked on small AR 102(12) relative to the Y-axis. Cell regions 100A(1) & 100A(2), and cell regions 100A(2) & 100A(3) are free from being separated from each other by one or more dummy ARs relative to the Y-axis.

Cell region 100C(1) includes large AR 106(6) stacked on large AR 106(7) relative to the Y-axis. Cell region 100C(2) includes large AR 106(8) stacked on large AR 106(9) relative to the Y-axis. Cell region 100C(3) includes large AR 106(10) stacked on large AR 106(11) relative to the Y-axis. Cell regions 100C(1) & 100C(2), and cell regions 100C(2)

& 100C(3) are free from being separated from each other by one or more dummy ARs relative to the Y-axis.

In FIG. 4C, relative to the X-axis, cell regions 100A(3)-100A(5) are separated from cell regions 100C(1)-100C(3) by filler regions. Small AR 102(7) is separated from large AR 106(7) by filler region 426(2). Small AR 102(8) is separated from large AR 106(8) by filler region 426(3). Small AR 102(9) is separated from large AR 106(8) by filler region 428(2). Filler region 428(2) also separates small AR 102(10) from large AR 106(9). Small AR 102(11) is separated from large AR 106(9) by filler region 426(4). Small AR 102(12) is separated from large AR 106(10) by filler region 426(5).

In some embodiments, filler region 426(3) includes an AR region doped with a P-type dopant. In some embodiments, filler region 426(4) includes an AR region doped with an N-type dopant. In some embodiments, filler regions 428(1), 426(2), 428(2), 426(5) and 428(3) are undoped because they separate ARs of different dopant types. In some embodiments, one or more of filler regions 422(1), 422(2) and 424(1) includes dummy transistors each of which has a shorted-configuration (shorted-transistor), the shorted-transistor including a gate electrode, a first source/drain (S/D) region and a second S/D region which are coupled together.

The height of cell region 418C, h_418C, is the sum of the heights of cell regions 100C(1), 100C(2) and 100C(3) such that h_418C=3*h_100C=6*h_row. Cell region 214A is described as a PN_TH+PPNNPP cell region, where TH indicates triple height, and where PN_TH indicates the stack of cell region 100C(1) on cell region 100C(2) and cell region 100C(2) on cell region 100C(3).

Each of filler regions 426(1)-426(6) and 428(1)-428(3) has width w_fill=n*SP, as discussed above.

Figure 5:
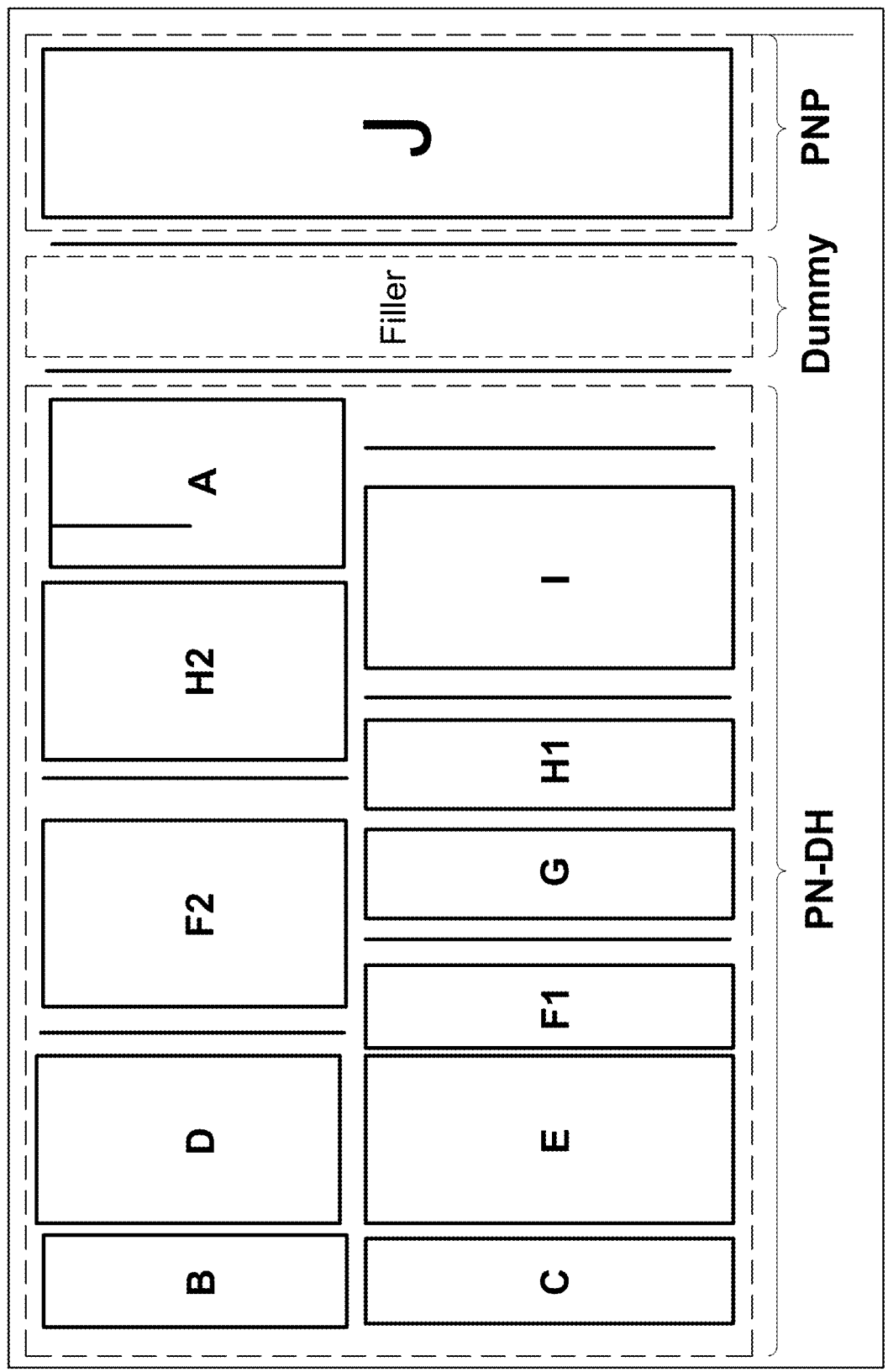
FIG. 5 is a layout diagram of a flip-flop circuit, in accordance with some embodiments.

FIG. 5 is a layout diagram of an SDFQ 530 corresponding to SDFQ 330A of FIG. 3A, in accordance with some embodiments.

SDFQ 530 of FIG. 5 is divided into a section having the PN_DH architecture of FIG. 4A which is based on the PN architecture of FIG. 1A, a dummy section and a section having the PPNNPP architecture of FIG. 1C. Relative to the X-axis, the dummy section is between the PN_DH and PPNNPP sections.

Relative to the X-axis, the PN_DH section of FIG. 5 is to the left of the PPNNPP section of FIG. 3B. Accordingly, SDFQ 330B has the PN_DH+PPNNPP architecture of cell region 418A of FIG. 4A. In FIG. 5, zones have been marked to denote corresponding groups of transistors in SDFQ 330A of FIG. 3A. Zones A, B, C, F1, F2, G, H1, H2 and I are in the PN_DH section of FIG. 5. Zone J is in the PPNNPP section of FIG. 5.

Figure 6:
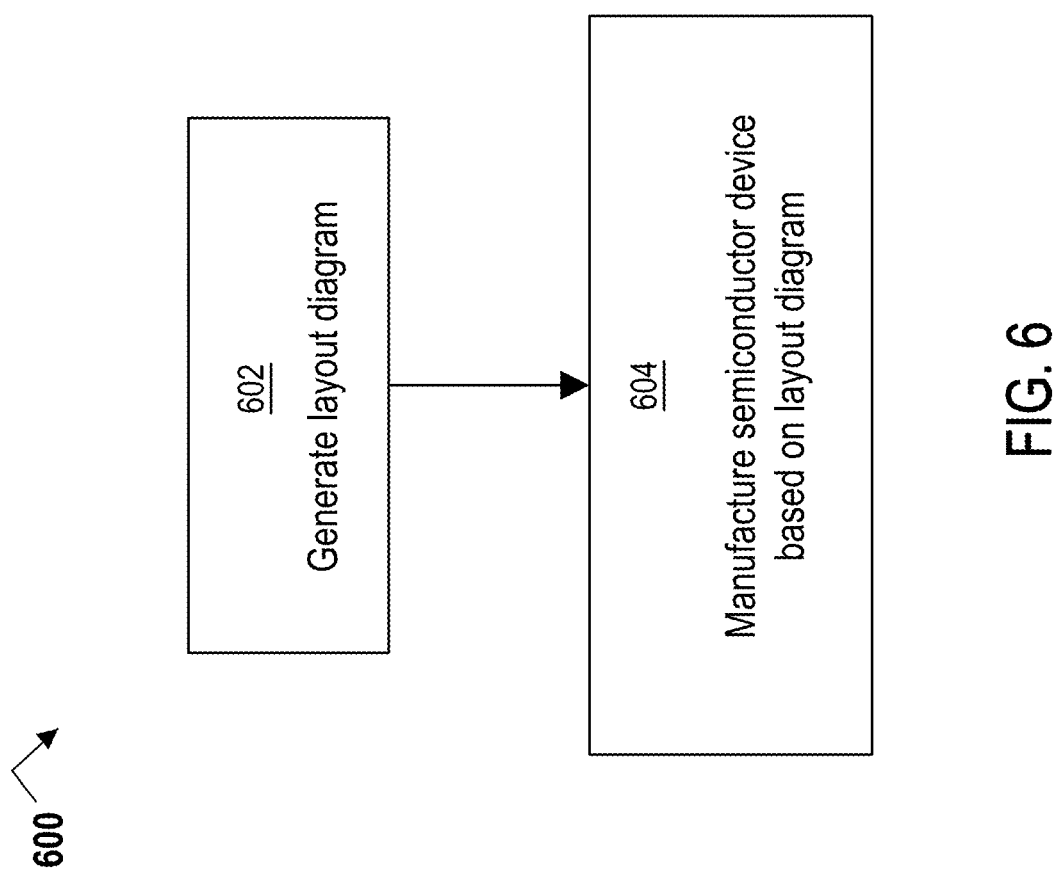
FIGS. 6 and 7A-7B are flowcharts of corresponding methods of manufacturing a memory device, in accordance with some embodiments.

FIG. 6 is a flowchart 600 of a method of manufacturing a memory device, in accordance with some embodiments.

The method of flowchart (flow diagram) 600 is implementable, for example, using EDA system 800 (FIG. 8, discussed below) and an IC manufacturing system 900 (FIG. 9, discussed below), in accordance with some embodiments. Examples of a semiconductor device which can be manufactured according to the method of flowchart 600 include semiconductor devices based on the layout diagrams of FIGS. 2A-2F, 3B, 3D, 4A-4C and 5, or the like.

In FIG. 6, the method of flowchart 600 includes blocks 602-604. At block 602, a layout diagram is generated which, among other things, includes one or more of layout diagrams disclosed herein, or the like. Block 602 is implementable, for example, using EDA system 800 (FIG. 8, discussed below), in accordance with some embodiments. From block 602, flow proceeds to block 604.

At block 604, based on the layout diagram, at least one of (A) one or more photolithographic exposures are made or (B) one or more semiconductor masks are fabricated or (C) one or more components in a layer of a semiconductor device are fabricated. See discussion below of IC manufacturing system 900 in FIG. 9 below.

Figure 7A:
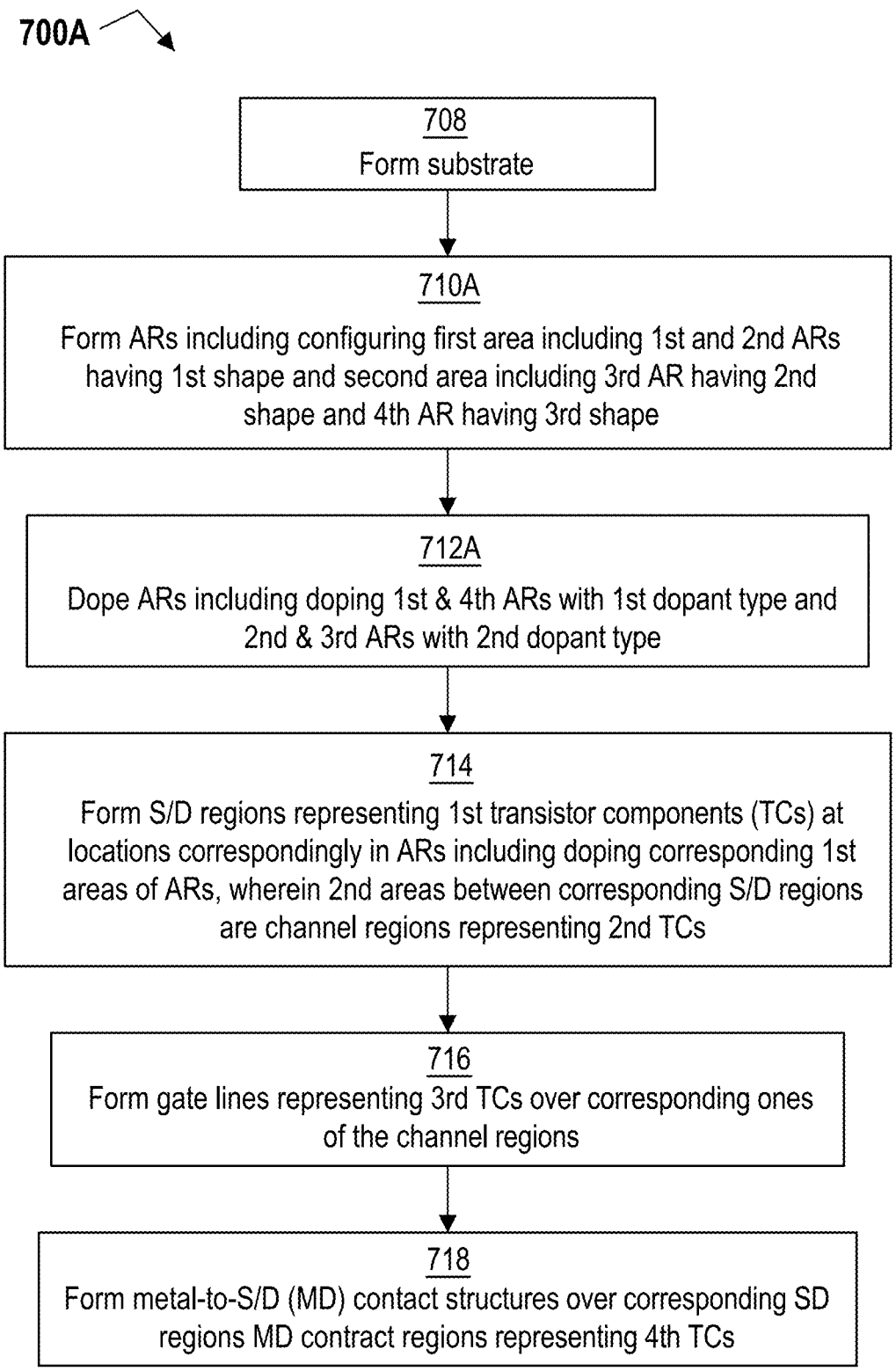

FIG. 7A is a flowchart 700A of a method of fabricating a semiconductor device, and more specifically a memory device, in accordance with some embodiments.

Flowchart 700A is an example of block 604 of FIG. 6. Flowchart 700A includes blocks 708, 710A, 712A, and 714-718. Examples provided in the context of the discussion of blocks 708, 710A, 712A, and 714-718 assume first, second and third orthogonal directions that are, e.g., correspondingly parallel to the X-axis, Y-axis and Z-axis. The method of flowchart 700A is implementable, for example, using IC manufacturing system 900 (FIG. 9, discussed below), in accordance with some embodiments. Examples of a semiconductor device which can be manufactured according to the method of flowchart 700A include semiconductor devices having the cell regions of FIGS. 1A-1E, 2A-2F, 4A-4C, or the like.

At block 708, a substrate is formed. From block 708, flow proceeds to block 710A.

At block 710A, active regions (ARs) are formed in the substrate including configuring a first area with first and second ARs having a first shape, and a second area including a third AR having a second shape and a fourth AR having a third shape. An example of the first area is cell region 100A, or the like. Examples of the first and second ARs include small ARs 102(1) and 102(2) of FIG. 1A, or the like. An example of the second area is cell region 100B, or the like. An example of the third AR is medium AR 104(1) or 104(2) of FIG. 1B, or the like. An example of the fourth AR is large AR 106(1) of FIG. 1B, or the like. From block 710A, flow proceeds to block 712A.

At block 712A, the ARs are doped including doping the first and fourth ARs with a first dopant type and the second and third ARs with a second dopant type. An example of the first dopant type is P-type dopant. An example of the second dopant type is N-type dopant. From block 712A, flow proceeds to block 714.

At block 714, source/drain (S/D) regions representing first transistor components (TCs) are formed at locations correspondingly in the ARs including doping corresponding first areas of the active regions, wherein second areas of the ARs which are between corresponding S/D regions are channel regions representing 2nd TCs. From block 714, flow proceeds to block 716.

At block 716, gate lines representing third TCs are formed over corresponding ones of the channel regions. From block 716, flow proceeds to block 718.

At block 718, metal-to-S/D (MD) contact structures representing 3rd TCs are formed over corresponding S/D regions.

Regarding FIG. 7A, in some embodiments, the forming ARs of block 710A, the doping the ARs of block 712A, the forming S/D regions and corresponding channel regions of block 714, the forming gate lines of block 716 and the forming MD contact structures of block 718 result in corresponding transistors. Examples of the transistors include the transistors of SDFQ 330A of FIG. 3A, the transistors in the various zones of FIG. 3B, SDFQ 330C, the transistors in the various zones of FIG. 3D, or the like.

Figure 7B:
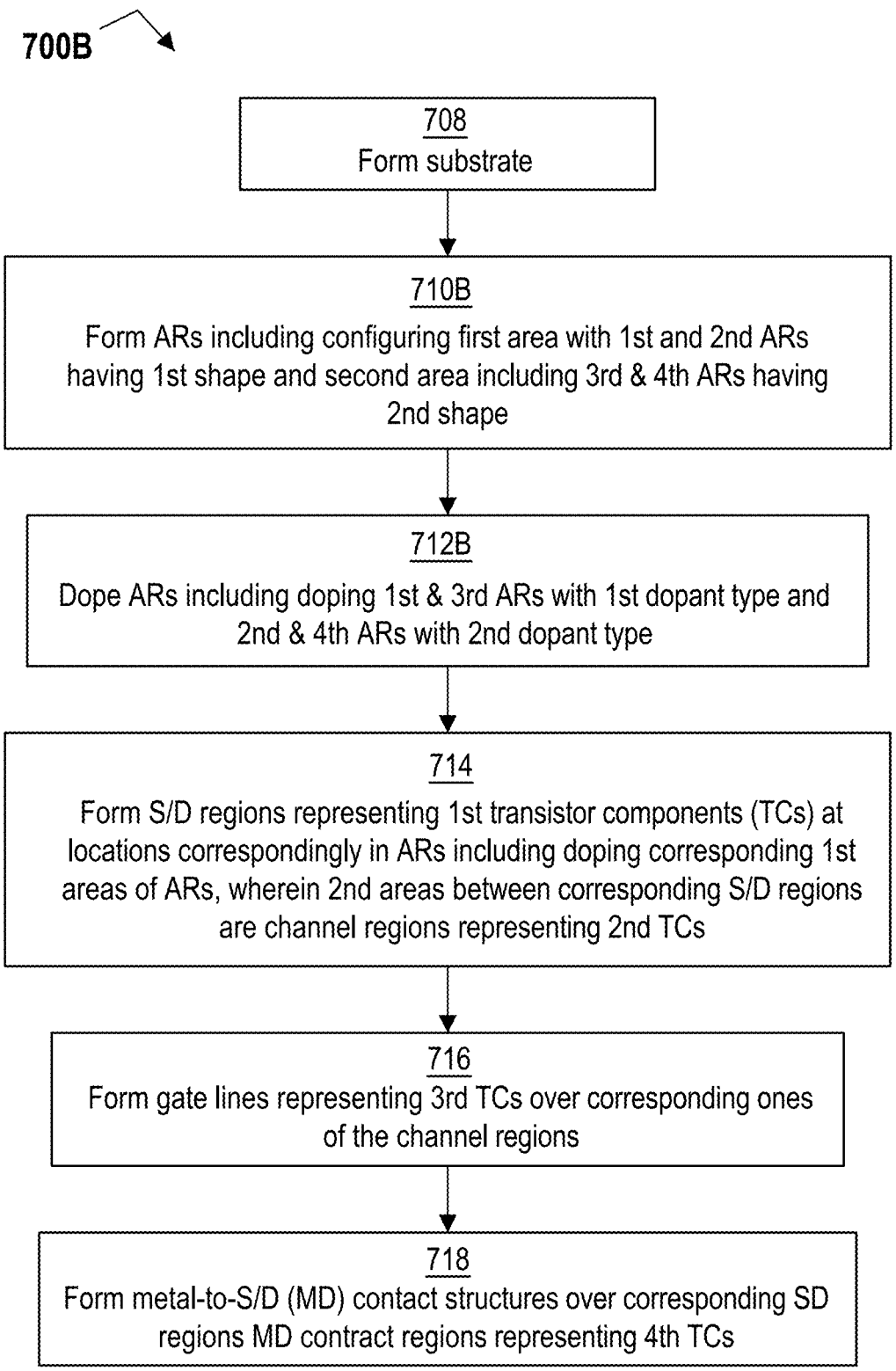

FIG. 7B is a flowchart 700B of a method of fabricating a semiconductor device, and more specifically a memory device, in accordance with some embodiments.

In FIG. 7B, flowchart 700B is similar to flowchart 700A of FIG. 7A. For brevity, the discussion will focus more on differences between FIG. 7B and FIG. 7A than on similarities. Whereas FIG. 7A includes blocks 710A and 712A, flowchart 700B includes blocks 710B and 712B.

At block 710B, active regions (ARs) are formed in the substrate including configuring a first area with first and second ARs having a first shape, and a second area including third and fourth ARs having a second shape. Examples of the first area include cell regions 100A(3)-100A(5) of FIG. 4C, or the like. Examples of the first AR include small ARs 102(7), 102(9) and 102(11) of FIG. 4C, or the like. Examples the second AR include small ARs 102(8), 102(10) and 102(12) of FIG. 4C, or the like. Examples of the second area include cell regions 100C(1)-100C(3) of FIG. 4C, or the like. Examples of the third AR include large ARs 106(6), 106(8) and 106(10) of FIG. 4C, or the like. An example of the fourth AR is large AR 106(1) of FIG. 1B, or the like. Examples of the fourth AR include large ARs 106(7), 106(9) and 106(11) of FIG. 4C, or the like. From block 710B, flow proceeds to block 712B.

At block 712B, the ARs are doped including doping the first and third ARs with a first dopant type and the second and fourth ARs with a second dopant type. An example of the first dopant type is P-type dopant. An example of the second dopant type is N-type dopant.

Regarding FIG. 7B, in some embodiments, the forming ARs of block 710B, the doping the ARs of block 712B, the forming S/D regions and corresponding channel regions of block 714, the forming gate lines of block 716 and the forming MD contact structures of block 718 result in corresponding transistors. Examples of the transistors include the transistors of SDFQ 330A of FIG. 3A, the transistors in the various zones of FIG. 5, or the like.

Figure 8:
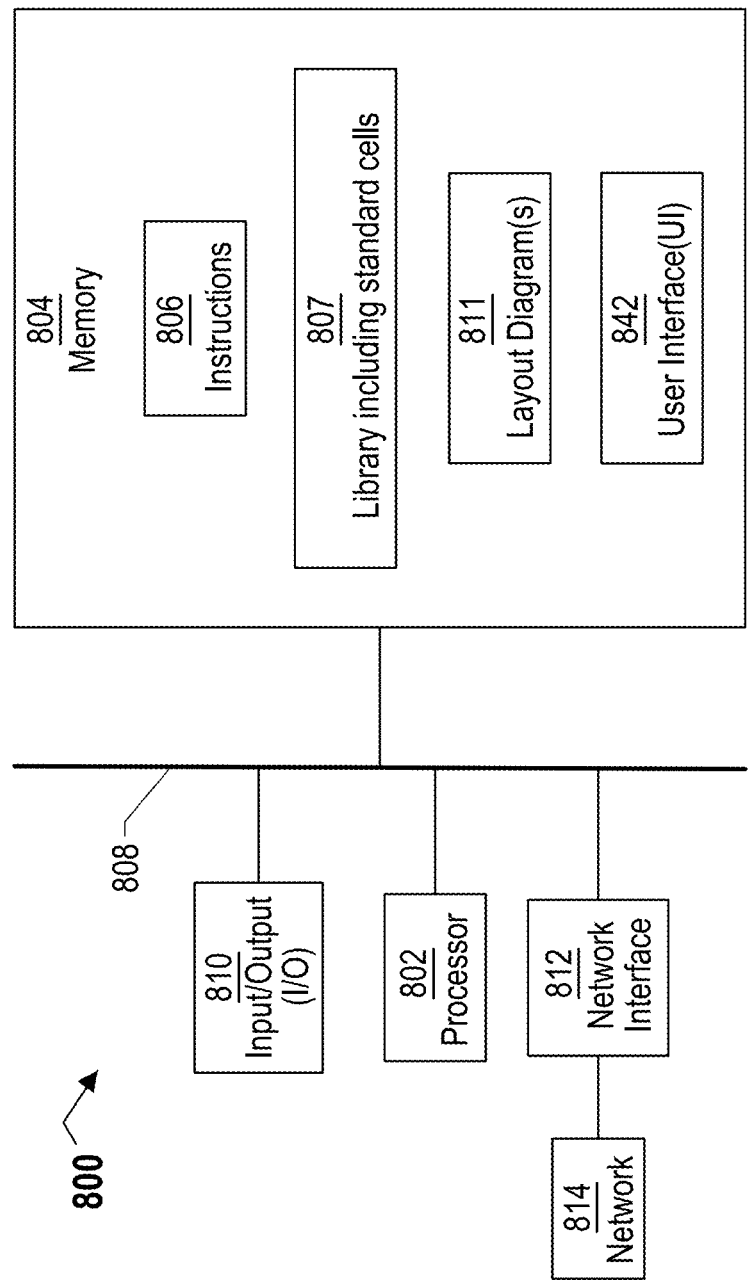
FIG. 8 is a block diagram of an electronic design automation (EDA) system in accordance with some embodiments.

FIG. 8 is a block diagram of an electronic design automation (EDA) system 800 in accordance with some embodiments.

In some embodiments, EDA system 800 includes an automatic placement and routing (APR) system. In some embodiments, EDA system 800 is a general purpose computing device including a hardware processor 802 and a non-transitory, computer-readable storage medium 804. Storage medium 804, amongst other things, is encoded with, i.e., stores, computer program code 806, i.e., a set of executable instructions. Execution of instructions 806 by hardware processor 802 represents (at least in part) an EDA tool which implements a portion or all of, e.g., the method of FIG. 5 (block 502), methods of generating layout diagrams such as FIGS. 2B-2R, methods of generating layout diagrams corresponding to block diagrams such as FIGS. 1A-1H, or the like, in accordance with one or more embodiments (hereinafter, the noted processes and/or methods). Storage medium 804, amongst other things, stores layout diagrams 811 such as the layout diagrams disclosed herein, other the like.

Processor 802 is electrically coupled to computer-readable storage medium 804 via a bus 808. Processor 802 is further electrically coupled to an I/O interface 810 by a bus 808. A network interface 812 is further electrically connected to processor 802 via bus 808. Network interface 812 is connected to a network 814, so that processor 802 and computer-readable storage medium 804 are capable of connecting to external elements via network 814. Processor 802 is configured to execute computer program code 806 encoded in computer-readable storage medium 804 in order to cause system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, storage medium 804 stores computer program code 806 configured to cause system 800 (where such execution represents (at least in part) the EDA tool) to be usable for performing a portion or all of the noted processes and/or methods. In one or more embodiments, storage medium 804 further stores information which facilitates performing a portion or all of the noted processes and/or methods. In one or more embodiments, storage medium 804 stores library 807 of standard cells including such standard cells as disclosed herein. In some embodiments, storage medium 804 stores one or more layout diagrams 811.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

EDA system 800 further includes network interface 812 coupled to processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 800.

System 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. EDA system 800 is configured to receive information related to a user interface (UI) through I/O interface 810. The information is stored in computer-readable medium 804 as UI 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 800. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
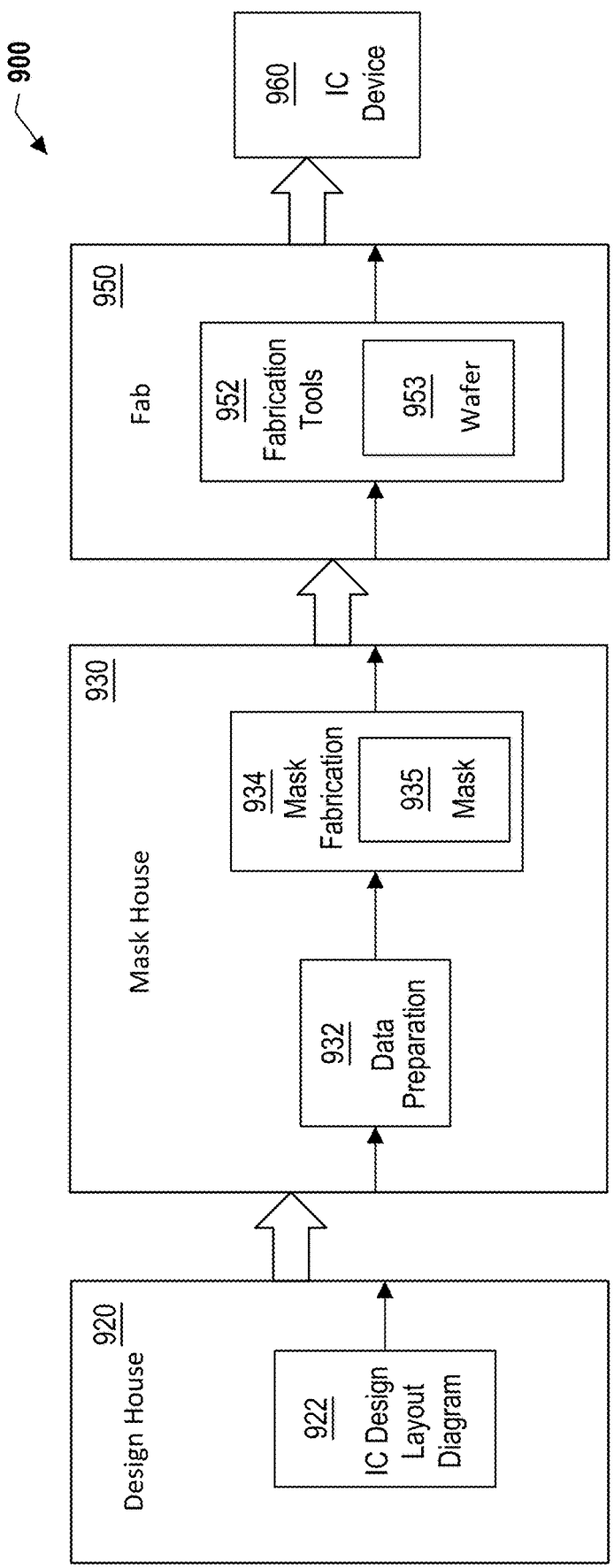
FIG. 9 is a block diagram of an integrated circuit (IC) manufacturing system, and an IC manufacturing flow associated therewith, in accordance with some embodiments.

FIG. 9 is a block diagram of an integrated circuit (IC) manufacturing system 900, and an IC manufacturing flow associated therewith, in accordance with some embodiments.

Based on the layout diagram generated by block 502 of FIG. 5, the IC manufacturing system 900 implements block 504 of FIG. 5 wherein at least one of (A) one or more semiconductor masks or (B) at least one component in a layer of an inchoate semiconductor integrated circuit is fabricated using manufacturing system 900.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout 922. IC design layout 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout 922 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Source/drain region(s) may refer to a source or a drain, individually or collectively, dependent upon the context. Design house 920 implements a proper design procedure to form IC design layout 922. The design procedure includes one or more of logic design, physical design or place and route. IC design layout 922 is presented in one or more data files having information of the geometrical patterns. For example, IC design layout 922 is expressed in a GDSII file format or DFII file format.

Mask house 930 includes data preparation 932 and mask fabrication 934. Mask house 930 uses IC design layout 922 to manufacture one or more masks 935 to be used for fabricating the various layers of IC device 960 according to IC design layout 922. Mask house 930 performs mask data preparation 932, where IC design layout 922 is translated into a representative data file ("RDF"). Mask data preparation 932 supplies the RDF to mask fabrication 934. Mask fabrication 934 includes a mask writer. A mask writer converts the RDF to an image on a substrate, such as a mask (reticle) or a semiconductor wafer. The design layout is manipulated by mask data preparation 932 to comply with particular characteristics of the mask writer and/or requirements of IC fab 950. In FIG. 9, mask data preparation 932, mask fabrication 934, and mask 935 are illustrated as separate elements. In some embodiments, mask data preparation 932 and mask fabrication 934 are collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout 922. In some embodiments, mask data preparation 932 includes further resolution enhancement techniques (RET), such as off-axis illumination, sub-resolution adjust features, phase-shifting masks, other suitable techniques, and the like or combinations thereof. In some embodiments, inverse lithography technology (ILT) is further used, which treats OPC as an inverse imaging problem.

In some embodiments, mask data preparation 932 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 934, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout 922 to fabricate a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 922.

The above description of mask data preparation 932 has been simplified for the purposes of clarity. In some embodiments, mask data preparation 932 includes additional features such as a logic operation (LOP) to modify the IC design layout according to manufacturing rules. Additionally, the processes applied to IC design layout 922 during data preparation 932 may be executed in a variety of different orders.

After mask data preparation 932 and during mask fabrication 934, a mask 935 or a group of masks 935 are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 934 is used in a variety of processes. For example, such a mask(s) is used in an ion implantation process to form various doped regions in the semiconductor wafer, in an etching process to form various etching regions in the semiconductor wafer, and/or in other suitable processes.

IC fab 950 is an IC fabrication business that includes one or more manufacturing facilities for the fabrication of a variety of different IC products. In some embodiments, IC fab 950 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 950 uses mask (or masks) 935 fabricated by mask house 930 to fabricate IC device 960 using fabrication tools 952. Thus, IC fab 950 at least indirectly uses IC design layout 922 to fabricate IC device 960. In some embodiments, a semiconductor wafer 953 is fabricated by IC fab 950 using mask (or masks) 935 to form IC device 960. Semiconductor wafer 953 includes a silicon substrate or other proper substrate having material layers formed thereon. Semiconductor wafer further includes one or more of various doped regions, dielectric features, multilevel interconnects, and the like (formed at subsequent manufacturing steps).

In some embodiments, cell region of a semiconductor device includes: active regions (ARs) formed as predetermined shapes on a substrate including: first and second ARs having a first shape and correspondingly first and second dopant types; a third AR having a second shape and the second dopant type; and a fourth AR having a third shape and the first dopant type; the first and second ARs being arranged in a first area of the cell region; the third and fourth ARs being arranged in a second area of the cell region; the second area being adjacent to the first area relative to a first direction; the first shape being smaller than the second shape; and the second shape being smaller than the third shape.

In some embodiments, the first direction is perpendicular to long axes correspondingly of the ARs.

In some embodiments, relative to the first direction, the first area shares a border with the second area.

In some embodiments, relative to the first direction, a border of the first area is separated from a border of the second area by a dummy region.

In some embodiments, the first direction is parallel to long axes correspondingly of the ARs.

In some embodiments, relative to the first direction, a border of the first area is separated from a border of the second area by a dummy region.

In some embodiments, the active regions (ARs) further include: fifth and sixth ARs having the first shape and correspondingly the first and second dopant types; and relative to a second direction perpendicular to the first direction, the first and second ARs are stacked as a first unit and the fifth and sixth ARs are stacked as a second unit, and the second unit is stacked on the first unit.

In some embodiments, the ARs further include: a fifth AR having the second shape and the second dopant type; and the fifth AR as well as the third and fourth ARs are arranged in the second area.

In some embodiments, relative to a second direction that is parallel to long axes correspondingly of the ARs, the fourth AR is between the third AR and the fifth AR.

In some embodiments, a cell region of a semiconductor device includes: active regions (ARs) formed as predetermined shapes on a substrate including: first and second ARs having a first shape and correspondingly first and second dopant types; third and fourth ARs having a second shape and correspondingly the first and second dopant types; the first and second ARs being arranged in a first area of the cell region; the third and fourth ARs being arranged in a second area of the cell region; the second area being adjacent to the first area relative to a first direction; the first shape being smaller than the second shape.

In some embodiments, the first direction is perpendicular to long axes correspondingly of the ARs.

In some embodiments, relative to the first direction, a border of the first area is separated from a border of the second area by a dummy region.

In some embodiments, the first direction is parallel to long axes correspondingly of the ARs.

In some embodiments, relative to the first direction, a border of the first area is separated from a border of the second area by a dummy region.

In some embodiments, a method (of forming semiconductor device) including: forming active regions having predetermined shapes on a substrate including: configuring a first area to include first and second ARs having a first shape; configuring a second area to be adjacent to the first area relative to a first direction and to include third AR having a second shape and a fourth AR having a third shape, the first shape being smaller than the second shape, and the second shape being smaller than the third shape; doping the ARs including: doping the first and fourth ARs with a first dopant type; and doping the second and third ARs with a second dopant type; forming source/drain (S/D) regions including doping first areas of the active regions, the S/D regions representing first transistor-components, wherein second areas of the active regions which are between corresponding S/D regions are channel regions representing second transistor-components; forming gate lines over corresponding ones of the channel regions, the gate lines representing third transistor-components; and forming metal-to-S/D (MD) contact structures over corresponding ones of the S/D regions, the MD contact structures representing fourth transistor-components; and the forming active regions, the doping the ARs, the forming S/D regions, the forming MD contact structures and the forming gate lines resulting in corresponding transistors.

In some embodiments, the forming active regions, the forming S/D regions, the forming MD contact structures and the forming gate lines further resulting in: a first set of the first to fourth transistor-components connected as corresponding one of the transistors that define a primary latch; a second set of the first to fourth transistor-components connected as corresponding one of the transistors that define a secondary latch; and a third set of the first to fourth transistor-components connected as corresponding transistors that define a clock buffer; a fourth set of the first to fourth transistor-components connected as corresponding ones of the transistors that define an output buffer; the primary latch, the secondary latch, the output buffer and the clock buffer comprise a D flip-flop (DFF); the primary latch includes a first sleepy inverter and a first non-sleepy (NS) inverter; the secondary latch includes a second sleepy inverter and a second NS inverter; and the clock buffer includes first and second NS inverters; a first group of some but not all of the transistors being in the first area; and ones of the transistors which comprise the output buffer being in the second area.

In some embodiments, ones of the transistors which comprise the first non-sleepy (NS) inverter are in the second area; and ones of the transistors which comprise the second NS inverter are in the second area.

In some embodiments, the forming active regions, the forming S/D regions, the forming MD contact structures and the forming gate lines further results in a fifth set of the first to fourth transistor-components connected as corresponding ones of the transistors that define an internal buffer; the internal buffer is included in the D flip-flop (DFF); and ones of the transistors which comprise the internal buffer are in the second area.

In some embodiments, the forming active regions, the forming S/D regions, the forming MD contact structures and the forming gate lines further results in a fifth set of the first to fourth transistor-components connected as corresponding ones of the transistors that define a scan buffer; and ones of the transistors which comprise the scan buffer are in the second area.

In some embodiments, the forming active regions, the forming S/D regions, the forming MD contact structures and the forming gate lines further results in a fifth set of the first to fourth transistor-components connected as corresponding ones of the transistors that define a multiplexer; and first ones of the transistors which comprise the multiplexer are in the first area; and second ones of the transistors which comprise the multiplexer are in the second area.

In some embodiments, a method (of forming semiconductor device) including: forming active regions having predetermined shapes on a substrate including: configuring a first area to include first and second ARs having a first shape; configuring a second area to be adjacent to the first area relative to a first direction and to include third and fourth ARs having a second shape, and the first shape being smaller than the second shape; doping the ARs including: doping the first and third ARs with a first dopant type; and doping the second and fourth ARs with a second dopant type; forming source/drain (S/D) regions including doping first areas of the active regions, the S/D regions representing first transistor-components, wherein second areas of the active regions which are between corresponding S/D regions are channel regions representing second transistor-components; forming gate lines over corresponding ones of the channel regions, the gate lines representing third transistor-components; and forming metal-to-S/D (MD) contact structures over corresponding ones of the S/D regions, the MD contact structures representing fourth transistor-components; and the forming active regions, the doping the ARs, the forming S/D regions, the forming MD contact structures and the forming gate lines resulting in corresponding transistors.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A cell region of a semiconductor device, the cell region comprising:
    active regions (ARs) formed as predetermined shapes on a substrate including:
        first and second ARs having a first shape and correspondingly first and second dopant types;
        a third AR having a second shape and the second dopant type; and
        a fourth AR having a third shape and the first dopant type;
    the first and second ARs being arranged in a first area of the cell region;
    the third and fourth ARs being arranged in a second area of the cell region;
    the second area being adjacent to the first area relative to a first direction;
    the first shape being smaller than the second shape; and
    the second shape being smaller than the third shape.

2. The device of claim 1, wherein:
    the first direction is perpendicular to long axes correspondingly of the ARs.

3. The device of claim 2, wherein:
    relative to the first direction, the first area shares a border with the second area.

4. The device of claim 2, wherein:
    relative to the first direction, a border of the first area is separated from a border of the second area by a dummy region.

5. The device of claim 1, wherein:
    the first direction is parallel to long axes correspondingly of the ARs.

6. The device of claim 5, wherein:
    relative to the first direction, a border of the first area is separated from a border of the second area by a dummy region.

7. The device of claim 6, wherein:
    the active regions (ARs) further include:
        fifth and sixth ARs having the first shape and correspondingly the first and second dopant types; and
    relative to a second direction perpendicular to the first direction,
        the first and second ARs are stacked as a first unit and the fifth and sixth ARs are stacked as a second unit, and
        the second unit is stacked on the first unit.

8. The device of claim 1, wherein:
    the ARs further include:
        a fifth AR having the second shape and the second dopant type; and
    the fifth AR as well as the third and fourth ARs are arranged in the second area.

9. The device of claim 8, wherein:
relative to a second direction that is parallel to long axes correspondingly of the ARs, the fourth AR is between the third AR and the fifth AR.

10. A cell region of a semiconductor device, the cell region comprising:
active regions (ARs) formed as predetermined shapes on a substrate including:
first and second ARs having a first shape and correspondingly first and second dopant types;
third and fourth ARs having a second shape and correspondingly the first and second dopant types;
the first and second ARs being arranged in a first area of the cell region;
the third and fourth ARs being arranged in a second area of the cell region;
the second area being adjacent to the first area relative to a first direction;
the first shape being smaller than the second shape.

11. The device of claim 10, wherein:
the first direction is perpendicular to long axes correspondingly of the ARs.

12. The device of claim 11, wherein:
relative to the first direction, a border of the first area is separated from a border of the second area by a dummy region.

13. The device of claim 10, wherein:
the first direction is parallel to long axes correspondingly of the ARs.

14. The device of claim 13, wherein:
relative to the first direction, a border of the first area is separated from a border of the second area by a dummy region.

15. A method of forming semiconductor device, the method comprising:
forming active regions having predetermined shapes on a substrate including:
configuring a first area to include first and second ARs having a first shape;
configuring a second area to be adjacent to the first area relative to a first direction and to include third AR having a second shape and a fourth AR having a third shape,
the first shape being smaller than the second shape, and the second shape being smaller than the third shape;
doping the ARs including:
doping the first and fourth ARs with a first dopant type; and
doping the second and third ARs with a second dopant type;
forming source/drain (S/D) regions including doping first areas of the active regions, the S/D regions representing first transistor-components, wherein second areas of the active regions which are between corresponding S/D regions are channel regions representing second transistor-components;
forming gate lines over corresponding ones of the channel regions, the gate lines representing third transistor-components; and
forming metal-to-S/D (MD) contact structures over corresponding ones of the S/D regions, the MD contact structures representing fourth transistor-components; and
the forming active regions, the doping the ARs, the forming S/D regions, the forming MD contact structures and the forming gate lines resulting in corresponding transistors.

16. The method of claim 15, wherein:
the forming active regions, the forming S/D regions, the forming MD contact structures and the forming gate lines further resulting in:
a first set of the first to fourth transistor-components connected as corresponding one of the transistors that define a primary latch;
a second set of the first to fourth transistor-components connected as corresponding one of the transistors that define a secondary latch; and
a third set of the first to fourth transistor-components connected as corresponding transistors that define a clock buffer;
a fourth set of the first to fourth transistor-components connected as corresponding ones of the transistors that define an output buffer;
the primary latch, the secondary latch, the output buffer and the clock buffer comprise a D flip-flop (DFF);
the primary latch includes a first sleepy inverter and a first non-sleepy (NS) inverter;
the secondary latch includes a second sleepy inverter and a second NS inverter; and
the clock buffer includes first and second NS inverters;
a first group of some but not all of the transistors being in the first area; and
ones of the transistors which comprise the output buffer being in the second area.

17. The method of claim 16, wherein:
ones of the transistors which comprise the first non-sleepy (NS) inverter are in the second area; and
ones of the transistors which comprise the second NS inverter are in the second area.

18. The method of claim 16, wherein:
the forming active regions, the forming S/D regions, the forming MD contact structures and the forming gate lines further results in a fifth set of the first to fourth transistor-components connected as corresponding ones of the transistors that define an internal buffer;
the internal buffer is included in the D flip-flop (DFF); and
ones of the transistors which comprise the internal buffer are in the second area.

19. The method of claim 16, wherein:
the forming active regions, the forming S/D regions, the forming MD contact structures and the forming gate lines further results in a fifth set of the first to fourth transistor-components connected as corresponding ones of the transistors that define a scan buffer; and
ones of the transistors which comprise the scan buffer are in the second area.

20. The method of claim 16, wherein:
the forming active regions, the forming S/D regions, the forming MD contact structures and the forming gate lines further results in a fifth set of the first to fourth transistor-components connected as corresponding ones of the transistors that define a multiplexer; and
first ones of the transistors which comprise the multiplexer are in the first area; and
second ones of the transistors which comprise the multiplexer are in the second area.

* * * * *